US011941254B2

(12) United States Patent
Steinmetz et al.

(10) Patent No.: US 11,941,254 B2
(45) Date of Patent: Mar. 26, 2024

(54) TEST MEMORY SUB-SYSTEMS THROUGH VALIDATION OF RESPONSES TO PROOF OF SPACE CHALLENGES

(71) Applicant: Micron Technology, Inc., Boise, ID (US)

(72) Inventors: Joseph Harold Steinmetz, Loomis, CA (US); Luca Bert, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/550,795

(22) Filed: Dec. 14, 2021

(65) Prior Publication Data

US 2023/0185459 A1 Jun. 15, 2023

(51) Int. Cl.
*G06F 3/06* (2006.01)

(52) U.S. Cl.
CPC .......... *G06F 3/0619* (2013.01); *G06F 3/0653* (2013.01); *G06F 3/0673* (2013.01)

(58) Field of Classification Search
None
See application file for complete search history.

(56) References Cited

U.S. PATENT DOCUMENTS

| | | | |
|---|---|---|---|
| 8,296,380 B1 | 10/2012 | Kelly et al. | |
| 9,674,162 B1 | 6/2017 | Miller et al. | |
| 9,916,478 B2 | 3/2018 | Slik | |
| 10,101,931 B1 * | 10/2018 | Camp | G06F 12/0866 |
| 10,729,030 B1 | 7/2020 | Cousineau et al. | |
| 10,831,691 B1 | 11/2020 | Dazzi et al. | |
| 11,107,071 B2 | 8/2021 | Carlsson et al. | |
| 2006/0288034 A1 | 12/2006 | Do et al. | |
| 2012/0246391 A1 | 9/2012 | Meir et al. | |
| 2014/0189890 A1 * | 7/2014 | Koeberl | G09C 1/00 726/34 |
| 2015/0254108 A1 | 9/2015 | Kurtzman et al. | |
| 2015/0363248 A1 | 12/2015 | D'abreu | |
| 2016/0292672 A1 | 10/2016 | Fay et al. | |
| 2016/0330627 A1 | 11/2016 | Zhang | |
| 2016/0379212 A1 | 12/2016 | Bowman et al. | |
| 2017/0220292 A1 | 8/2017 | Hashimoto | |
| 2017/0337534 A1 | 11/2017 | Goeringer et al. | |
| 2018/0007025 A1 | 1/2018 | Oberheide et al. | |
| 2019/0108518 A1 | 4/2019 | Asif et al. | |
| 2019/0108519 A1 | 4/2019 | Asif et al. | |
| 2019/0280863 A1 | 9/2019 | Meyer et al. | |
| 2019/0324995 A1 | 10/2019 | Jakobsson | |

(Continued)

*Primary Examiner* — Yaima Rigol
*Assistant Examiner* — Alexander J Yoon
(74) *Attorney, Agent, or Firm* — Greenberg Traurig

(57) ABSTRACT

A memory sub-system, such as a solid state drive (SSD), having host interface configured to receive at least read commands and write commands from an external host system. The SSD has memory cells formed on at least one integrated circuit die, and a processing device configured to control executions of the read commands to retrieve data from the memory cells and executions the write commands to store data into the memory cells. During an autonomous self-test operation of the memory sub-system, the memory sub-system is configured to generate random challenges of proof of space, generate using a proof of space plot, stored in the memory cells, responses to the random challenges respectively, and determine validity of the responses to evaluate health of the memory cells.

20 Claims, 12 Drawing Sheets

(56) References Cited

U.S. PATENT DOCUMENTS

| | | |
|---|---|---|
| 2019/0349185 A1 | 11/2019 | Kim et al. |
| 2019/0370069 A1 | 12/2019 | Swadling et al. |
| 2019/0379642 A1 | 12/2019 | Simons et al. |
| 2020/0133898 A1 | 4/2020 | Therene et al. |
| 2020/0226080 A1 | 7/2020 | Tarango et al. |
| 2020/0389312 A1 | 12/2020 | Boneh et al. |
| 2021/0271667 A1* | 9/2021 | Cohen ................ G06F 12/0223 |
| 2022/0043937 A1* | 2/2022 | Spalding ............... H04L 9/0866 |
| 2022/0083683 A1 | 3/2022 | Murck et al. |
| 2022/0116225 A1 | 4/2022 | Cohen et al. |
| 2023/0053269 A1 | 2/2023 | Yang et al. |
| 2023/0132211 A1 | 4/2023 | Ateniese et al. |
| 2023/0139330 A1 | 5/2023 | Lee et al. |

* cited by examiner

US 11,941,254 B2

TEST MEMORY SUB-SYSTEMS THROUGH VALIDATION OF RESPONSES TO PROOF OF SPACE CHALLENGES

TECHNICAL FIELD

At least some embodiments disclosed herein relate to memory systems in general, and more particularly, but not limited to the production and diagnosis of memory systems.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
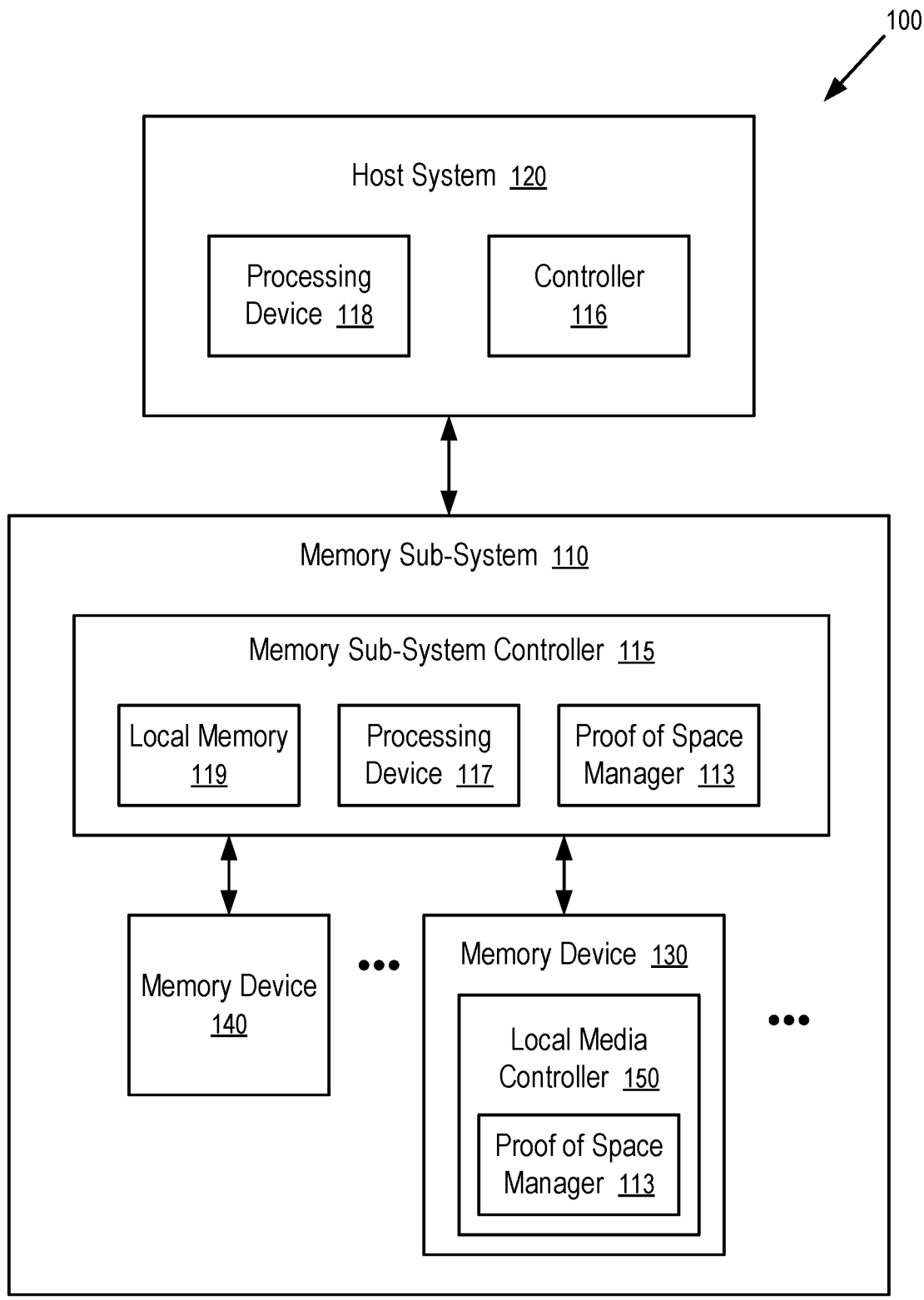
FIG. 1 illustrates an example computing system having a memory sub-system in accordance with some embodiments of the present disclosure.

At least some aspects of the present disclosure are directed to determination of the health of memory cells of a memory sub-system based on validation of responses to proof of space challenges. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

Memory cells of a memory sub-system can be tested by writing data to the memory cells and reading the data back from the memory cells for comparing with the data that is written into the data. The test data can be erased after the evaluation of the health of the memory cells. However, writing test data into the memory cells consumes the useful life of the memory cells. When a host system is connected to the memory sub-system to perform the test in a manufacturing facility, the host system is not available to perform other tasks.

At least some aspects of the present disclosure address the above and other deficiencies and challenges by using the lookup tables usable for proof of space to test the memory cells of the memory sub-system in the manufacturing facility. After the testing, the lookup tables can be provided in the memory sub-system as a by-product useful in proof of space activities, before the storage space occupied by the lookup tables is needed and reclaimed.

A conventional memory sub-system, such as a hard disk drive (HDD) or a solid state drive (SSD), can be used in activities that require the proof of data storage space. There are known types of challenge-response computations that can be implemented via a set of lookup tables. When the lookup tables are stored in the hard drive or solid state drive, a correct response to a challenge can be generated efficiently using the lookup tables with little computing power and energy consumption. Without storing the lookup tables, it can be unfeasible and/or impractical to generate the correct response on the fly within a short period of time. Thus, in response to a challenge, a correct response to the challenge, generated within a threshold period of time from the challenge, can be seen as a result of the response being generated using the lookup tables stored in a data storage device. Storing the lookup tables occupies an amount of data storage space. Thus, the correct response can be used as a proof of the possession of the amount of spare storage space that is currently used to store the lookup tables. A cryptocurrency network can use proof of space (e.g., to replace proof of work used in other cryptocurrency networks, such as Bitcoin) to improve energy efficiency of computations related to cryptocurrency activities. For example, Chia Network uses proof of space and time to replace energy intensive proof of work.

In general, a plot suitable for proof of space includes data used in challenge-response activities. Such data of a plot typically includes a set of lookup tables with numbers that appear to be random and that are generated from a small amount of initial data. For a given challenge as an input, the lookup tables of the plot can be used to generate a response with very little time and computation and thus little energy expenditure. The correctness of the response can be easily verified using the initial data without the lookup tables. However, it is very difficult and statistically impossible to generate the correct response without the lookup tables. Thus, the correct response can be used as a proof that the response is from an entity having the lookup tables and thus the storage space occupied by the plot of lookup tables.

To test the memory cells of a memory sub-system in a manufacturing facility, a plot can be written into the memory cells of the memory sub-system. A set of random challenges can be generated to test the correctness of data retrieved back through read operations performed on the memory cells storing the plot data. Since the correctness of the responses to the challenges can be determined using a small set of the initial data, the memory sub-system can be configured to perform test autonomously. Once a host system of the manufacturing facility sets up the memory sub-system for testing, the test can be performed autonomously by the memory sub-system (e.g., a solid state drive) without further host assistance. Further, the test can be performed with varying parameters for reading the memory cells to generate data for the calibration operations to read the memory cells in the memory sub-system. For example, the test can be performed to determine the bit error rates, optimize read voltages, etc. For example, a manufacturing facility can generate a plot using a high-endurance memory (e.g., DRAM or cross point memory) and downloads the plot into a memory sub-system having a low-endurance memory (e.g., NAND). Alternatively, the plot can be generated at least in part using the memory sub-system. After the plot is stored in the memory sub-system, the memory sub-system can run self-test via random challenges generated within the memory sub-system. After the test, the plot can be left in the memory sub-system as a by-product. Further, after the memory sub-system is shipped and built into an endpoint device used by an end user and before the storage space occupied by the plot is reclaimed for applications and/or the operating system of the endpoint, the memory sub-system can periodically use the plot to perform self-test, to collect diagnostics data to monitor the health of the memory cells, to calibrate read parameters, etc.

A typical solid state drive (SSD) is better than a typical hard disk drive (HDD) in read/write access performance, especially for random access of stored data. The use of the lookup tables stored in a drive in generating a response to a proof of space challenge involves only a small number of data access operations; and thus, the access performance is not important in the response to the challenge. However, the generation of a lookup tables involves extensive read/write access. Thus, to reduce the time spent on the generation of the look up tables for proof of space activities, solid state drives (SSD) have been used in some instances. Subsequently, the lookup tables generated using solid state drives (SSD) can be moved into hard disk drives (HDD) for generating responses to proof of space. When a solid state drive (SSD) is specifically used for the purpose of generating the lookup tables for proof of space, the solid state drive (SSD) can experience intensive read/write operations; and its useful life can be depleted in a very short period of time.

Optionally, the generation of the lookup tables of a plot usable for proof of space can be used to burn in memory sub-systems in the manufacturing facility. When such a burn-in operation is performed, a test of the memory sub-system storing the plot can be performed; and the memory sub-system leaving the manufacturing facility can pre-store the plot. The plot stored in the memory sub-system is a useful by-product of the manufacturing process. The pre-stored plots shipped with the manufactured memory sub-systems can reduce the need for end users to perform operations to generate lookup tables for proof of space activities; and end users of the memory sub-systems manufactured using such a method have the added benefit of the pre-generated proof of space look up tables. Comparing to the use of random data to burn in and/or test memory sub-systems, the use of the plot in burn-in and/or test can result in useful by-products and reduce waste of resources.

For example, the read/write operations that are conventionally performed using random data, or a predetermined data pattern, to burn in a solid state drive (SSD) during its manufacture can be replaced, at least in part, by the read/write operations of plot generation. As a result, pre-generated plots can be offered as by-products of a new solid state drive (SSD) leaving the manufacturing facility. Further, plot generation activities can be controlled to achieve a desirable level of burn-in without excessive wearing on solid state drive (SSD). For example, write operations involved in generating a plot can be divided across multiple solid state drives (SSD). Thus, at least some of the newly manufactured solid state drives (SSD) have pre-generated plots as an added benefit.

To implement tasks related to proof of space, a conventional memory sub-system, such as a hard drive or a solid state drive, is to be connected to a host system to receive read/write commands generated by the host system. The host system plays an active role in implementing the proof of space tasks using the storage capacity of the conventional memory sub-system.

Optionally, an internal host can be implemented in a memory sub-system to control proof of space activities. For example, a solid state drive (SSD) can be configured with a host interface to provide storage services to a host system in a conventional way and, in addition, be configured with an internal host. Using the internal host, the solid state drive (SSD) can participate in proof of space activities and/or cryptocurrency activities in an autonomous way without the supervision and/or computing resources of an external host system connected to the host interface. For example, in the absence of commands from the host system connected to the host interface, the internal host of the solid state drive can be configured to automatically detect a network connection, generate read/write commands, and perform computations to participate in proof of space activities and/or cryptocurrency activities.

For example, independent of host activities and/or without the host system being active and/or connected to the host interface, the internal host can perform tasks such as plot generation, plot farming, etc. Thus, the solid state drive (SSD) as a spare component can be used in proof of space before being connected to a host system for normal usage.

The internal host can be configured to use the free space that is not yet used by a host system to generate and/or store one or more plots for proof of space. For example, the internal host can use a plot stored in the memory sub-system (e.g., a hard disk drive (HDD), a solid state drive (SSD), or a memory module) to generate responses for challenges, such as proof of space and time challenges in a cryptocurrency network (e.g., Chia Network, or similar networks). The use of plots to generate responses to proof of space challenges can be referred to as plot farming.

For improved security, aspects of proof of space activities and/or cryptocurrency activities of the internal host can be configured and/or regulated via configuration data specified using an administrative application. For example, the administrative control of the internal host can be accessed via the host system connected to the host interface of the memory sub-system. Alternatively, or in combination, the administrative control of the internal host can be accessed via a network connection (e.g., without the host system being active or being connected to the host interface).

In some implementations, the memory sub-system can be operational for proof of space activities and/or cryptocurrency activities even without a host system (or with the host system being placed in a sleep mode, a low energy mode, or a hibernation mode). For example, connecting the memory sub-system to a power supply and a network interface card can be sufficient to allow the memory sub-system to operate in a cryptocurrency network. Alternatively, the memory sub-system can be configured to operate in a cryptocurrency network under the condition that the memory sub-system is being connected to a host system that permits the memory sub-system to operate (e.g., when the host system is in an idle state, or independent of the activities of the host system). In some instances, the memory sub-system includes a network interface card, or a wireless transceiver for a network connection to a wireless access point. Thus, before the memory sub-system is installed in a computing system and/or connected to a host system to provide memory and/or storage services for the host system, the internal host of the memory sub-system can allow the free/available storage space of the memory sub-system to be used as a storage appliance in a cryptocurrency network for proof of space.

The internal host can be used to reduce the computation burden on the host system connected to the host interface of the memory sub-system. For example, the host system and the internal host can operate in a collaborative mode where the host system can delegate some or all of the computing tasks to the internal host.

In general, the administrative control can be used to specify whether the internal host is permitted to run autonomously, how much of the resources the internal host can use and when, what types of activities (e.g., plot generation, plot farming) are permitted, etc.

For further improved security, the internal host can be implemented via a secure memory device. For example, the firmware and/or configuration data of the internal host for proof of space activities and/or cryptocurrency activities can be protected via a security manager of the secure memory device. The security manager can prevent authorized access and/or modifications of the firmware and/or configuration data, and prevent the use of corrupted and/or tampered firmware and/or configuration data.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

In general, a memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or such a computing device that includes memory and a processing device.

The computing system 100 can include a host system 120 that is coupled to one or more memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

For example, the host system 120 can include a processor chipset (e.g., processing device 118) and a software stack executed by the processor chipset. The processor chipset can include one or more cores, one or more caches, a memory controller (e.g., controller 116) (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, a universal serial bus (USB) interface, a Fibre Channel, a Serial Attached SCSI (SAS) interface, a double data rate (DDR) memory bus interface, a Small Computer System Interface (SCSI), a dual in-line memory module (DIMM) interface (e.g., DIMM socket interface that supports Double Data Rate (DDR)), an Open NAND Flash Interface (ONFI), a Double Data Rate (DDR) interface, a Low Power Double Data Rate (LPDDR) interface, a Compute Express Link (CXL) interface, or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The processing device 118 of the host system 120 can be, for example, a microprocessor, a central processing unit (CPU), a processing core of a processor, an execution unit, etc. In some instances, the controller 116 can be referred to as a memory controller, a memory management unit, and/or an initiator. In one example, the controller 116 controls the communications over a bus coupled between the host system 120 and the memory sub-system 110. In general, the controller 116 can send commands or requests to the memory sub-system 110 for desired access to memory devices 130, 140. The controller 116 can further include interface circuitry to communicate with the memory sub-system 110. The interface circuitry can convert responses received from the memory sub-system 110 into information for the host system 120.

The controller 116 of the host system 120 can communicate with the controller 115 of the memory sub-system 110 to perform operations such as reading data, writing data, or erasing data at the memory devices 130, 140 and other such operations. In some instances, the controller 116 is integrated within the same package of the processing device 118. In other instances, the controller 116 is separate from the package of the processing device 118. The controller 116 and/or the processing device 118 can include hardware such as one or more integrated circuits (ICs) and/or discrete components, a buffer memory, a cache memory, or a combination thereof. The controller 116 and/or the processing device 118 can be a microcontroller, special purpose logic circuitry (e.g., a field programmable gate array (FPGA), an application specific integrated circuit (ASIC), etc.), or another suitable processor.

The memory devices 130, 140 can include any combination of the different types of non-volatile memory components and/or volatile memory components. The volatile memory devices (e.g., memory device 140) can be, but are not limited to, random access memory (RAM), such as dynamic random access memory (DRAM) and synchronous dynamic random access memory (SDRAM).

Some examples of non-volatile memory components include a negative-and (or, NOT AND) (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs, or any combination of such. In some embodiments, a particular memory device can include an SLC portion, an MLC portion, a TLC portion, a QLC portion, and/or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point type and NAND type memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations (e.g., in response to commands scheduled on a command bus by controller 116). The controller 115 can include hardware such as one or more integrated circuits (ICs) and/or discrete components, a buffer memory, or a combination thereof. The hardware can include digital circuitry with dedicated (i.e., hard-coded) logic to perform the operations described herein. The controller 115 can be a microcontroller, special purpose logic circuitry (e.g., a field programmable gate array (FPGA), an application specific integrated circuit (ASIC), etc.), or another suitable processor.

The controller 115 can include a processing device 117 (processor) configured to execute instructions stored in a local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 does not include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory devices 130. The controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory devices 130.

In some embodiments, the memory devices 130 include local media controllers 150 that operate in conjunction with the memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local media controller 150) for media management within the same memory device package. An example of a managed memory device is a managed NAND (MNAND) device.

The controller 115 and/or a memory device 130 can include a proof of space manager 113 configured to use the storage capacity of the memory sub-system 110 to show proof of space without the help or commands from the host system 120. In some embodiments, the controller 115 in the memory sub-system 110 includes at least a portion of the proof of space manager 113. In other embodiments, or in combination, the controller 116 and/or the processing device 118 in the host system 120 includes at least a portion of the proof of space manager 113. For example, the controller 115, the controller 116, and/or the processing device 118 can include logic circuitry implementing the proof of space manager 113. For example, the controller 115, or the processing device 118 (processor) of the host system 120, can be configured to execute instructions stored in memory for performing the operations of the proof of space manager 113 described herein. In some embodiments, the proof of space manager 113 is implemented in an integrated circuit chip disposed in the memory sub-system 110. In other embodiments, the proof of space manager 113 can be part of firmware of the memory sub-system 110, an operating system of the host system 120, a device driver, or an application, or any combination therein.

For example, the proof of space manager 113 implemented in the controller 115 can control the memory sub-system 110 to generate plots and/or farm plots in a cryptocurrency network without relying on the computing resources of the host system 120. The host system 120 can be in a low power mode, a sleep mode, or a hibernation mode, while the proof of space manager 113 is sufficient to operate the memory sub-system 110 to participate activities in a cryptocurrency network. The proof of space manager 113 can function as a host, specialized for proof of space activities and/or cryptocurrency activities, such that resources in the memory sub-system 110 that are not used by the host system 120 can be used to gain benefits of participating in proof of space activities and/or cryptocurrency activities.

When the memory sub-system 110 is in communication with the host system 120, the host system 120 can send commands to configure the operations of the proof of space manager 113. For example, the host system 120 can provide a user interface that is usable to specify whether the proof of space manager 113 is permitted to operate autonomously without instructions/requests from the host system 120. The permission can be specified by writing data to a register, or a predetermined location or region within a memory device (e.g., 130 or 140) in the memory sub-system 110. Similarly, the host system 120 can write configuration data into the memory sub-system 110 to specify how much of the storage capacity of the memory sub-system 110 can be used by the proof of space manager 113 in proof of space activities, when or under what conditions the proof of space activities are permitted, whether plot generation is permitted, whether plot farming is permitted, etc.

Optionally, the proof of space manager 113 can use a network connection without going through the host system 120; and the configuration data can be specified for the proof of space manager 113 via the network connection. For example, the memory sub-system 110 can include an interface for a connection to a network interface card, or a wireless transceiver for a wireless network connection to an access point. The interface is usable by the proof of space manager 113 without the processing device 118 and/or the controller 116 of the host system 120. In some implementations, the memory sub-system 110 can further include a network interface card and/or a wireless transceiver (e.g., for a wired network connection, for a WiFi connection, or Bluetooth connection, or a cellular communications connection); and providing power to the memory sub-system 110 with a connection to the Internet is sufficient to enable the memory sub-system 110 to operate in a cryptocurrency network.

Figure 2:
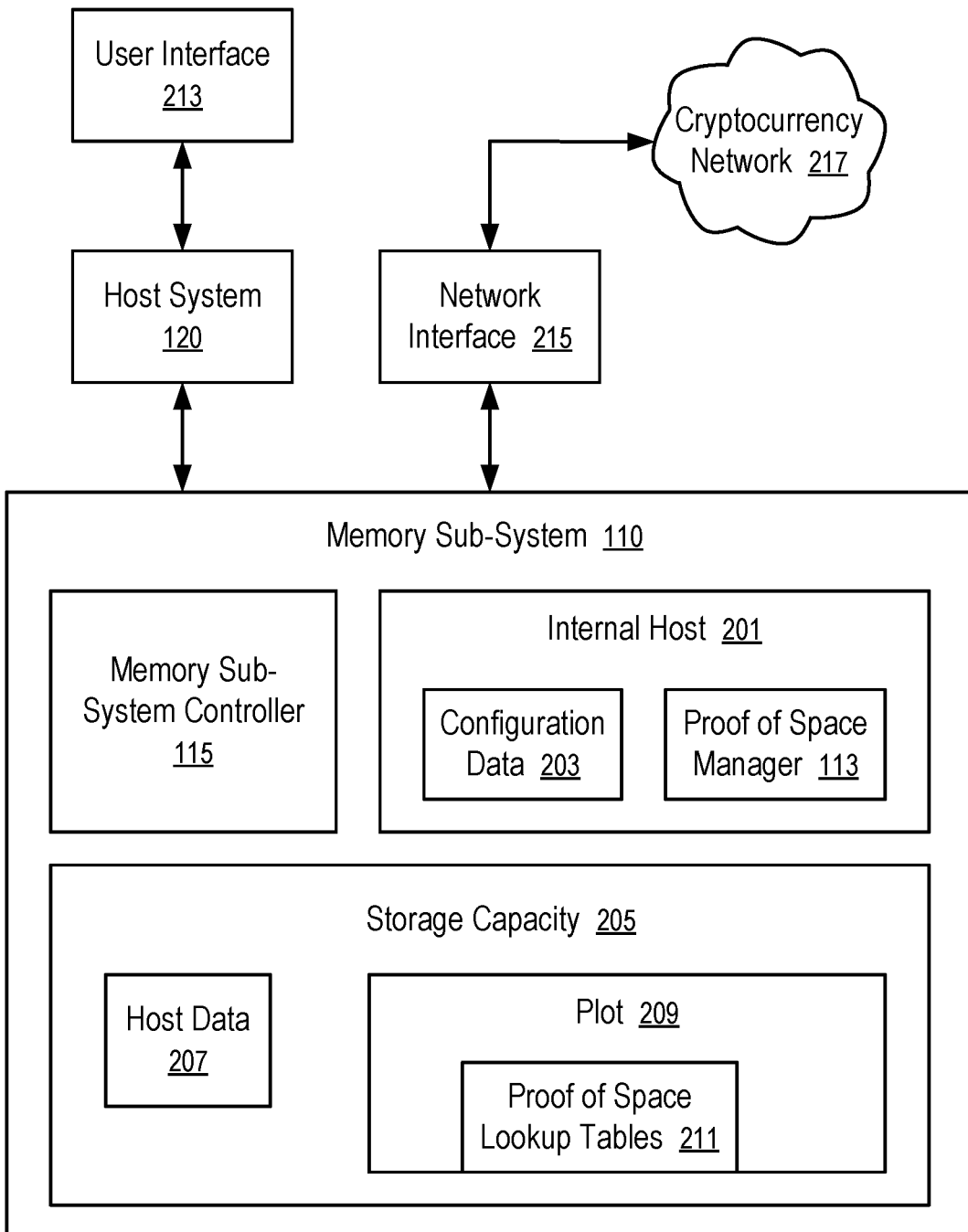
FIG. 2 shows a memory sub-system having an internal host to control proof of space activities according to one embodiment.

FIG. 2 shows a memory sub-system 110 having an internal host 201 to control proof of space activities according to one embodiment. For example, the memory sub-system 110 of FIG. 1 can be implemented according to FIG. 2.

In FIG. 2, the memory sub-system 110 has a memory sub-system controller 115 and an internal host 201. The internal host 201 has configuration data 203 and a proof of space manager 113 operable according to the permissions and restrictions specified in the configuration data 203.

When the memory sub-system 110 is not connected to the host system 120, the internal host 201 can function as a replacement host system of the memory sub-system 110 and control the operations of the memory sub-system 110 and the network interface 215.

For example, the internal host 201 can detect the connection to a network interface 215 and issue commands to the network interface 215 and the memory sub-system controller 115 in a way similar to the host system 120 using the memory sub-system 110 and the network interface 215. The proof of space manager 113 can use a portion of the storage capacity 205 of the memory sub-system 110 to store a plot 209 that includes proof of space lookup tables 211.

For example, the storage capacity 205 of the memory sub-system 110 can include the storage capacities of memory devices 130, 140 (e.g., illustrated in FIG. 1) configured in the memory sub-system 110. A portion of the storage capacity 205 can be reserved for servicing the host system 120 and store host data 207 received from the host system 120. Another portion of the storage capacity 205 that is not going to be used by the host system 120 for a period of time can be used to store a plot 209. Since the plot 209 is used to store the proof of space lookup tables 211, the storage space occupied by the plot 209 is not available for use by the host system 120 and thus considered the free/spare storage space.

To generate the plot 209, the internal host 201 can receive a small amount of initial data and perform computations to compute the numbers in the proof of space lookup tables 211 according to a predefined computing procedure. In general, any algorithms of proof of space can be used; and the implementation of the proof of space manager 113 is not limited to a particular cryptocurrency network (e.g., Chia Network).

To farm the plot 209, the internal host 201 can receive a challenge and use the plot 209 to generate a response that can be easily validated using the small amount of the initial data. The correct, validated response can be seen as a proof that the large amount of data of the plot 209 is stored in a storage space (e.g., in storage capacity 205 provided by memory devices 130, . . . , 140 of the memory sub-system 110).

Optionally, the host system 120 can also run an application to generate plots (e.g., as part of the host data 207) and farm the plots. Thus, the memory sub-system 110 is operable to have two parallel systems for plot generating and farming.

For example, the host system 120 can allocate a portion of the storage capacity 205 as a namespace. The memory sub-system controller 115 maps a logical address in the namespace into a physical address in the memory device(s) 130, . . . , 140 to store the host data 207. The internal host 201 is allowed to allocate a portion of the storage capacity 205 not used by the host system 120 as another namespace to store plot 209 controlled by the internal host 201. In some implementations, the internal host 201 and/or the host system 120 can use a separate namespace for each plot (e.g., 209) to simplify storage space management. When the storage space currently used by a plot (e.g., 209) is needed, the corresponding namespace can be deleted to free up the storage space occupied by the plot (e.g., 209).

In one implementation, the memory sub-system 110 is configured with two host interfaces. An external host interface of the memory sub-system 110 is connectable to an external host system 120; and an internal host interface is connected to the internal host 201. The memory sub-system controller 115 is accessible via any of the two host interfaces to receive read/write commands from the external host system 120 and the internal host 201 respectively. For example, the internal host 201 can include a processing device (processor) that is separate from the processing device 117 of the memory sub-system controller 115; and the proof of space manager 113 can be implemented via a special purpose logic circuit (e.g., a field programmable gate array (FPGA), an application specific integrated circuit (ASIC), a System on a Chip (SoC)), or a set of instructions executed by the processing device (processor).

In another implementation, the internal host 201 is implemented via firmware running in the processing device 117 of the memory sub-system controller 115. Thus, a portion of the processing power of the memory sub-system controller 115 can be used to execute the instructions of the proof of space manager 113 (e.g., to generate read/write commands of the internal host 201) without a physical host interface between the memory sub-system controller 115 and the internal host 201.

The host system 120 can run an application to provide a user interface 213 to specify and/or adjust the configuration data 203 of the internal host 201. Alternatively, a user device (e.g., a mobile phone, a tablet computer, a notebook computer, a personal computer, a personal media player) can be connected to the network interface 215 to specify and/or adjust the configuration data 203. The network interface 215 can include a transceiver for a wired or wireless network connection, such as a local area network, a wireless local area network, a personal area network, a cellular communications network, etc. The network interface 215 can be connected to a cryptocurrency network 217 that implements a blockchain using proof of space to regulate activities or transactions.

Figure 3:
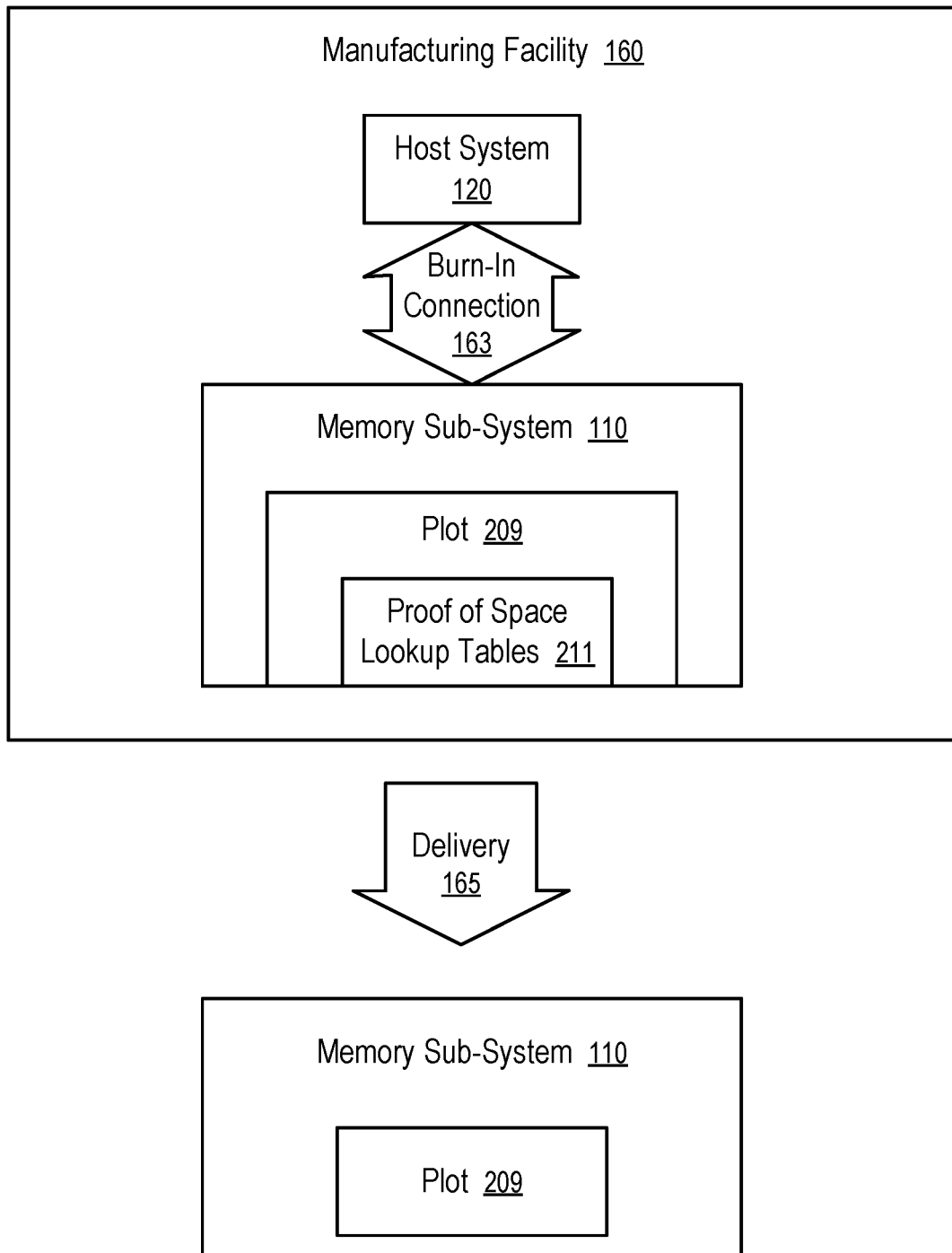
FIG. 3 shows the use of generation of proof of space plots in burn-in of a memory sub-system according to one embodiment.

FIG. 3 shows the use of generation of proof of space plots in burn-in of a memory sub-system according to one embodiment. For example, the memory sub-system 110 of FIG. 1 and/or FIG. 2 can be manufactured via the burn-in operation of FIG. 3.

In FIG. 3, the manufacturing facility 160 has a host system 120 configured to be connected to the memory sub-system 110 during testing, diagnosis, and/or burn-in. During a burn-in operation in the manufacturing facility 160, the memory sub-system 110 is connected to the host system 120. The connection 163 provided between the host system 120 and the memory sub-system 110 for the burn-in of the memory sub-system 110 is temporary while the memory sub-system 110 is in the manufacturing facility 160. Through the connection 163, the host system 120 can send commands to the memory sub-system 110 to generate a proof of space plot 209, that includes proof of space lookup tables 211.

For example, the host system 120 can obtain an initial data set for the generation of the plot 209. The initial data set can include a public cryptographic key of the manufacturing facility 160 or another entity that offers to validate plots for a team of users using a corresponding private cryptographic key. According to a predetermined process, the host system 120 can generate read/write commands transmitted over the connection 163 to the memory sub-system 110 to generate the proof of space lookup tables 211 of the plot 209.

When the memory sub-system 110 has an internal host 201 and/or a proof of space manager 113, the host system 120 can submit a request to generate the plot to the internal host 201 and/or the proof of space manager 113. After the internal host 201 receives, from the host system 120 of the manufacturing facility 160, the initial data set for the generation of the plot 209, the memory sub-system 110 can autonomously generate the read/write command and perform the computations to generate the plot 209.

For example, after the memory sub-system 110 enters the autonomous plot generation mode, the host system 120 can be disconnected from the memory sub-system 110 and be connected to another memory sub-system 110 to be tested, diagnosed, and/or burnt in. Thus, the utilization rate of the host system 120 is increased, while the memory sub-system 110 is in an autonomous plot generation mode to generate the plot 209 as part of the burn-in operation performed for the memory sub-system 110.

After the completion of the burn-in operation and the manufacturing process, the delivery 165 of the memory sub-system 110 includes the plot 209 as a by-product. An end user of the memory sub-system 110 may use the plot 209 to participate in proof of space activities in a cryptocurrency network 217 before the storage space occupied by the plot 209 is to be used.

For example, the end user can farm the plot 209 on the memory sub-system 110 or move the plot 209 to another data storage device (e.g., a hard disk drive (HDD)) for plot farming. For example, the end user may offer the plot 209 to another user to reduce the need to generate a new plot separately, which can involve the use of a data storage device for an extended period of time and/or cause wearing on a solid state drive (SSD).

In some instances, the level of wearing caused by the generation of a plot can be more than what is desirable for a burn-in operation performed on a memory sub-system 110. To reduce the wearing on the memory sub-system 110 during the burn-in through plot generation, the write operations of generating a plot 209 can be distributed to multiple memory sub-systems 110; and the by-products of burn-in multiple memory sub-systems 110 results in a plot 209 that is pre-stored in one of the memory sub-systems 110, as illustrated in FIG. 4.

Figure 4:
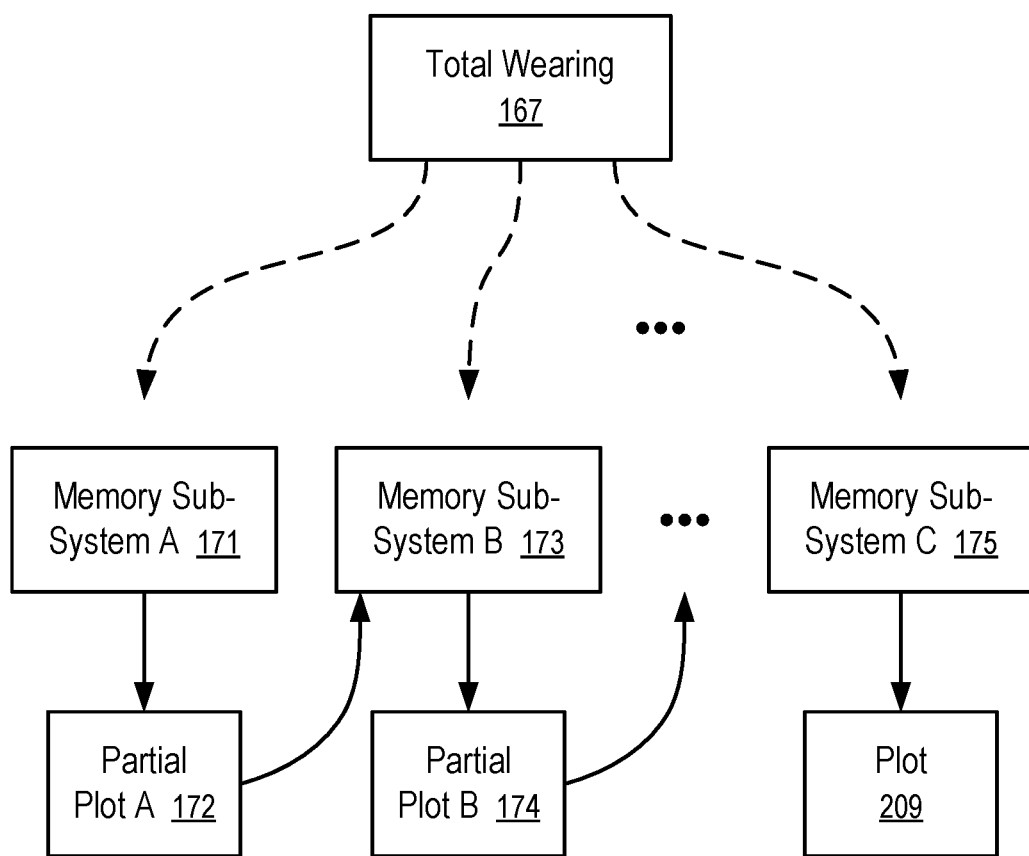
FIG. 4 shows a technique to distribute wearing across multiple memory sub-systems for burn-in via plot generation according to one embodiment.

FIG. 4 shows a technique to distribute wearing across multiple memory sub-systems for burn-in via plot generation according to one embodiment. For example, the technique of FIG. 4 can be implemented in the manufacturing facility 160 of FIG. 3 during burn-in of memory sub-systems 171, 173, . . . 175.

In FIG. 4, the read/write operations to generate a plot 209 having proof of space lookup tables 211 (illustrated in FIGS. 2 and 3) can cause a total amount of wearing 167, which can be excessive for burn-in of a single memory sub-system 175.

To reduce the amount of wearing applied to a memory sub-system (e.g., 171, 173, . . . , 175) during burn-in through plot generation, the generation of the plot 209 is divided into a plurality of stages. Each of the stage is performed on a separate memory sub-system 171, 173, . . . , 175 to distribute the total wearing 167 to the memory sub-systems 171, 173, ..., 175. For example, each of the memory sub-systems 171, 173, ..., 175 can be a memory sub-system 110 of FIG. 1 and/or FIG. 2.

For example, an initial stage of the computation for the generation of the plot 209 can be performed on the memory sub-system 171. The result of the initial stage is a partial plot 172 that is the basis for the next stage of the computation for the generation of the plot 209. The partial plot 172 can be moved or copied to the memory sub-system 173 to perform the next stage of the computation for the generation of the plot 209. The process can continuation until the last stage is performed on the memory sub-system 175 to generate the complete plot 209. The plot 209 can be provided as a by-product in the memory sub-system 175, while the partial plots 172, 174, etc. can be erased from the memory sub-systems 171, 173, etc.

For example, the host system 120 of the manufacturing facility 160 can be connected to the memory sub-systems 171, 173, ..., 175 one at a time to set up the computations of the stages to be performed in the respective memory sub-systems 171, 173, ..., 175. At the end of each stage of computations, the host system 120 of the manufacturing facility 160 can retrieve the generated partial plot (e.g., 172, 174, ...) for the next memory sub-system (e.g., 173, ..., 175) to set up the next stage of computations.

Alternatively, the proof of space manager 113 in the memory sub-systems 171, 173, ..., 175 can be configured to enable a burn-in mode of operations. After the host system 120 of the manufacturing facility 160 configures the roof of space manager 113 to operate the burn-in mode, the memory sub-systems 171, 173, ..., 175 can autonomously communicate with each other using a computer network within the manufacturing facility 160 without further instructions from the host system 120. A memory sub-system (e.g., 171) can communicate over the computer network to identify or discover a next memory sub-system (e.g., 173) that is in the burn-in mode and ready to take over the next stage of computation for the generation of the plot 209. Thus, the memory sub-system (e.g., 171) can provide the partial plot 172 and the task of performing the next stage of computation to the memory sub-system (e.g., 173). The handover of the partial plot 172 and the task of the next stage of computation can be performed by the internal hosts 201 without assistance from the host system 120 of the manufacturing facility 160. Alternatively, the host system 120 can function as a server in the computer network to schedule the propagation of the stages of computations for the generation of the plot 209. Alternatively, the memory sub-systems 171, 173, ..., 175 can be placed on a production line; and a production line is configured to connect the adjacent memory sub-systems (e.g., 171 and 173) for a peer to peer connection to hand over the partial plot (e.g., 172) and the next stage of computation.

Some memory sub-systems can have a large storage capacity such that the total wearing 167, when distributed evenly across the storage capacity of a memory sub-system, may not be excessive for the burn-in of the memory sub-system. In such a situation, the host system 120 or the internal host 201 can distribute the writing operations performed during the generation of the plot 209 across the memory cells in the memory sub-system, as illustrated in FIG. 5.

Figure 5:
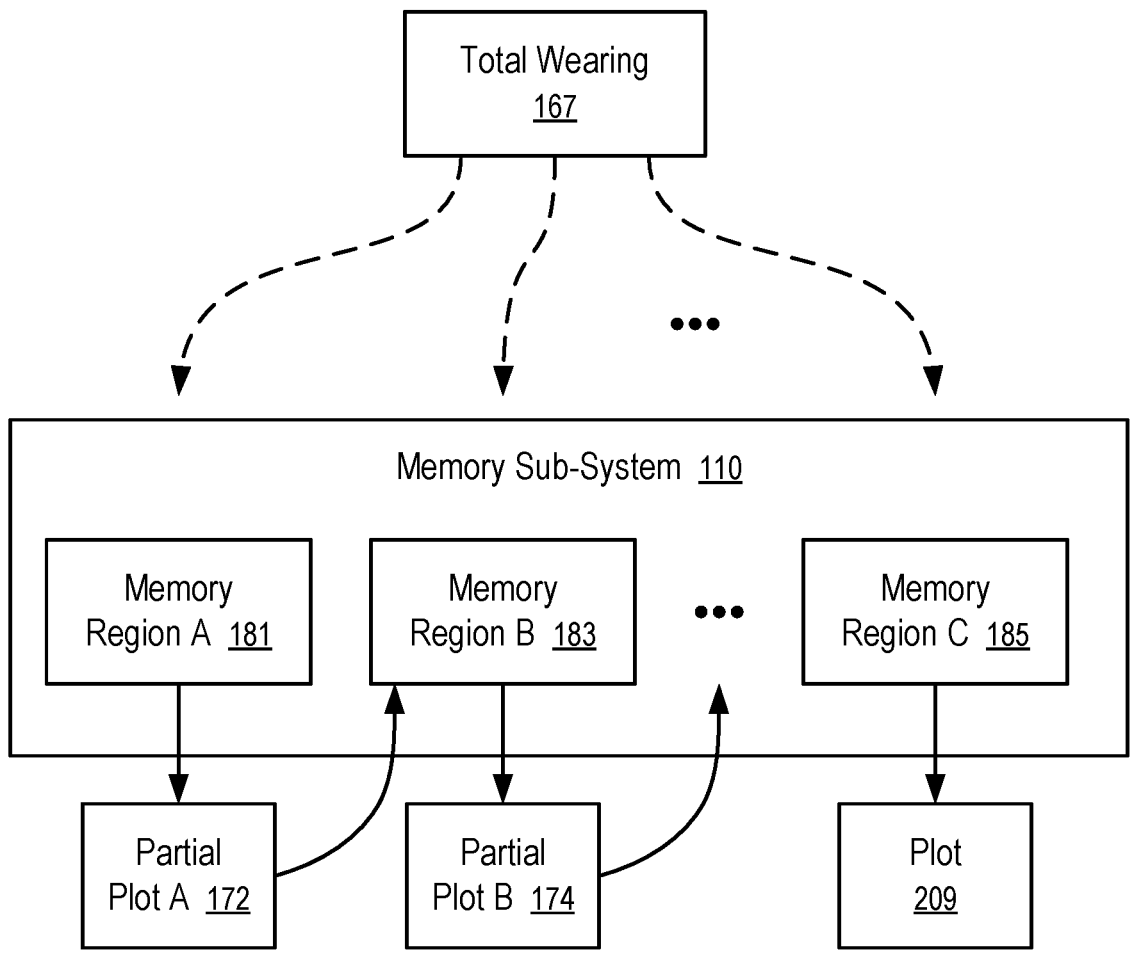
FIG. 5 shows a technique to distribute wearing across multiple memory regions in a memory sub-system for burn-in via plot generation according to one embodiment.

FIG. 5 shows a technique to distribute wearing across multiple memory regions in a memory sub-system for burn-in via plot generation according to one embodiment. For example, the technique of FIG. 5 can be implemented in the manufacturing facility 160 of FIG. 3 during burn-in of a memory sub-system 110, such as a memory sub-system 110 of FIG. 1 and/or FIG. 2.

In FIG. 5, each of the memory regions 181, 183, ..., 185 has sufficient data storage capacity to store a plot 209. Similar to FIG. 4, the computations for the generation of the plot 209 are divided into a number of stages. Each stage is performed in one of the memory regions (e.g., 181, 183, ...); and the complete plot 209 is stored in a memory region 185.

In some implementations, the memory regions 181, 183, ..., 185 can partially overlap with each other. In other implementations, the firmware of the memory sub-system 110 can include a flash translation layer that converts logical addresses to physical addresses in the memory regions 181, 183, ..., 185 and performs wear leveling in assigning logical addresses to physical addresses. Optionally, the flash translation layer performs wear leveling over the entire storage capacity that includes memory regions 181, 183, ..., 185.

The techniques of FIG. 4 and FIG. 5 can be combined to distribute the wearing (e.g., 167) caused by the generation of multiple plots (e.g., 209) across multiple memory sub-systems. The resulting plots (e.g., 209) can be stored in one or more of the memory sub-systems as the by-products of the burn-in operation.

Figure 6:
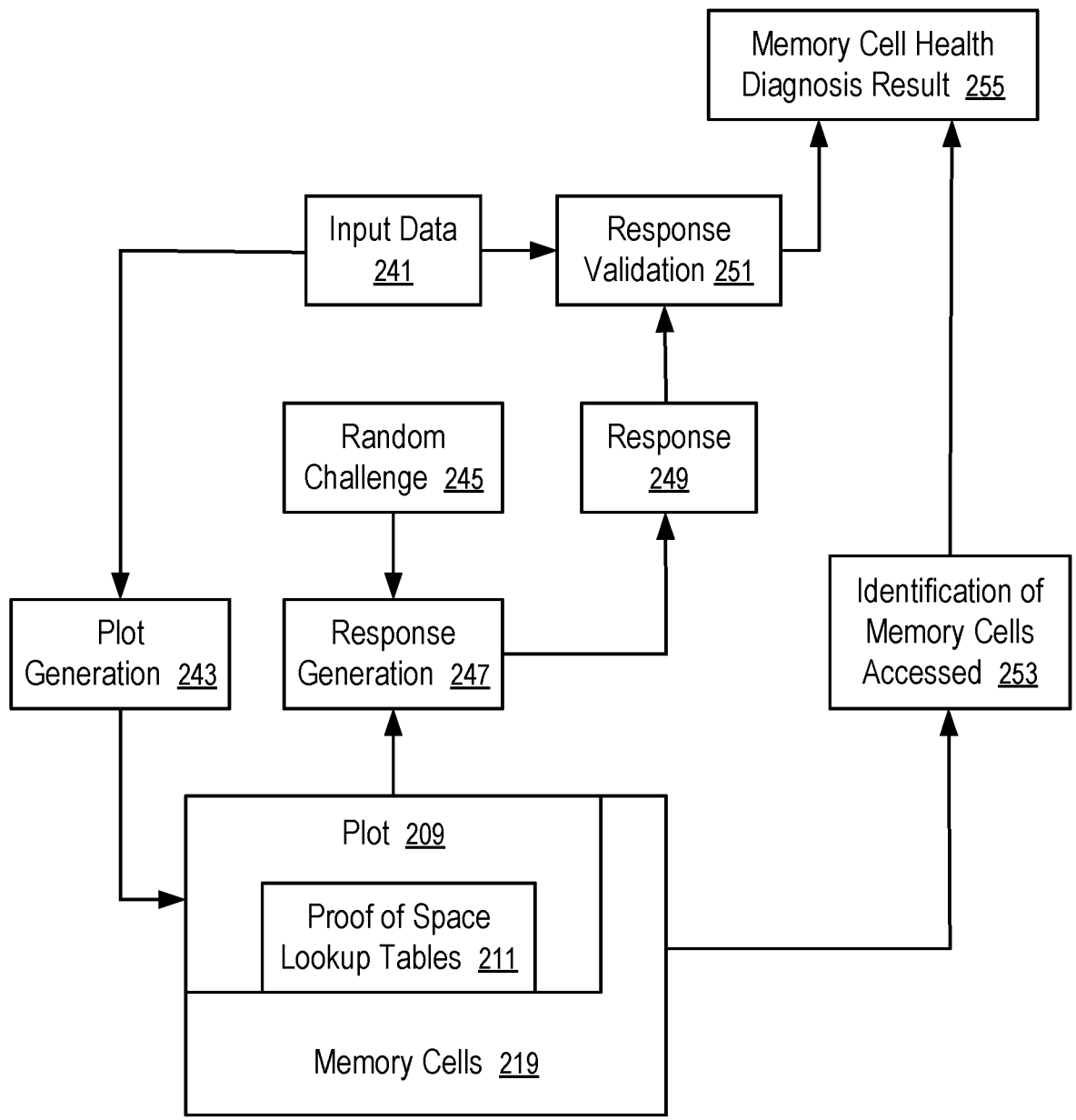
FIG. 6 shows the use of validation of responses to proof of space challenges to test memory cells according to one embodiment.

FIG. 6 shows the use of validation of responses to proof of space challenges to test memory cells according to one embodiment.

In FIG. 6, plot generation 243 uses a small amount of input data 241 to generate a plot 209 stored in memory cells 219 of a memory sub-system 110 of FIG. 1, FIG. 2, and/or FIG. 3.

For example, the techniques of plot generation illustrated in FIG. 3, FIG. 4, and/or FIG. 5 can be used in the plot generation 243 of FIG. 6. Optionally, the host system 120 of a manufacturing facility 160 can use a high-endurance memory to generate the plot 209 and then copy the plot 209 from the high-endurance memory into the memory sub-system 110. Alternatively, the host system 120 uses the high-endurance memory, or one or more other memory sub-systems (e.g., 171, 173) to generate a partial plot (e.g., 172 or 174), and use the partial plot in the memory sub-system to perform a stage of computation for the generation 243 of the plot 209.

After the plot 209 is stored in the memory cells 219 in the memory sub-system 110, random challenges 245 can be generated to request response 249 of proof of space based on the plot 209. In the response generation 247, the memory sub-system 110 retrieves, from the memory cells 219, a number of values from the proof of space lookup tables 211 to determine a response 249 corresponding to a challenge 245. The correctness of the response 249 can be verified using the input data 241. The proof of space propriety of the plot allows the response 249 to be validated during response validation 251 using the small amount of input data 241 without direct comparison between the data stored in the memory cells 219 and a known correct copy of the corresponding data (e.g., stored in another system). Thus, the memory sub-system 110 having the plot 209 stored in its memory cells 219 can be configured to perform autonomous self-test using the small amount of input data 241 and its internal host 201. During the autonomous self-test, the host system 120 of the manufacturing facility 160 can be disconnected from the memory sub-system 110 and used to perform other tasks.

During the response generation 247, the memory cells that have been read to generate the response 249 for the challenge are identified. The identification 253 of the memory cells being access can be provided in the test in connection with the response 249. When the response 249 is determined to be invalid in the response validation, it can be concluded that least some of the memory cells accessed during the response generation 247 provide erroneous reading; otherwise, the memory cells accessed during the response generation 247 provide correct reading. Thus, the combination of the response validation 251 and the identification 253 of memory cells accessed using the response generation 247 can provide a detailed memory cell health diagnosis result 255.

Optionally, the memory sub-system 110 can vary the parameters used to read memory cells 219. Based on the correctness of the response 249 generated with varying read parameters (e.g., read voltages for testing the states of the memory cells 219), the memory sub-system 110 can calibrate the parameters for optimal reading of the memory cells 219.

The memory cell health diagnosis results 255 can be used to determine the error rate of the memory cells 219 and determine whether the memory sub-system 110 having the memory cells 219 meets a quality control criterion.

If the memory sub-system 110 passes the quality control test, the plot 209 can be shipped with the memory sub-system 110 as a by-product. Further, before the storage space occupied by the plot 209 is to be reclaimed for use in a computing system of an end user, the memory sub-system 110 can perform the self-test and/or the calibration using the plot 209 and the input data 241.

Figure 7:
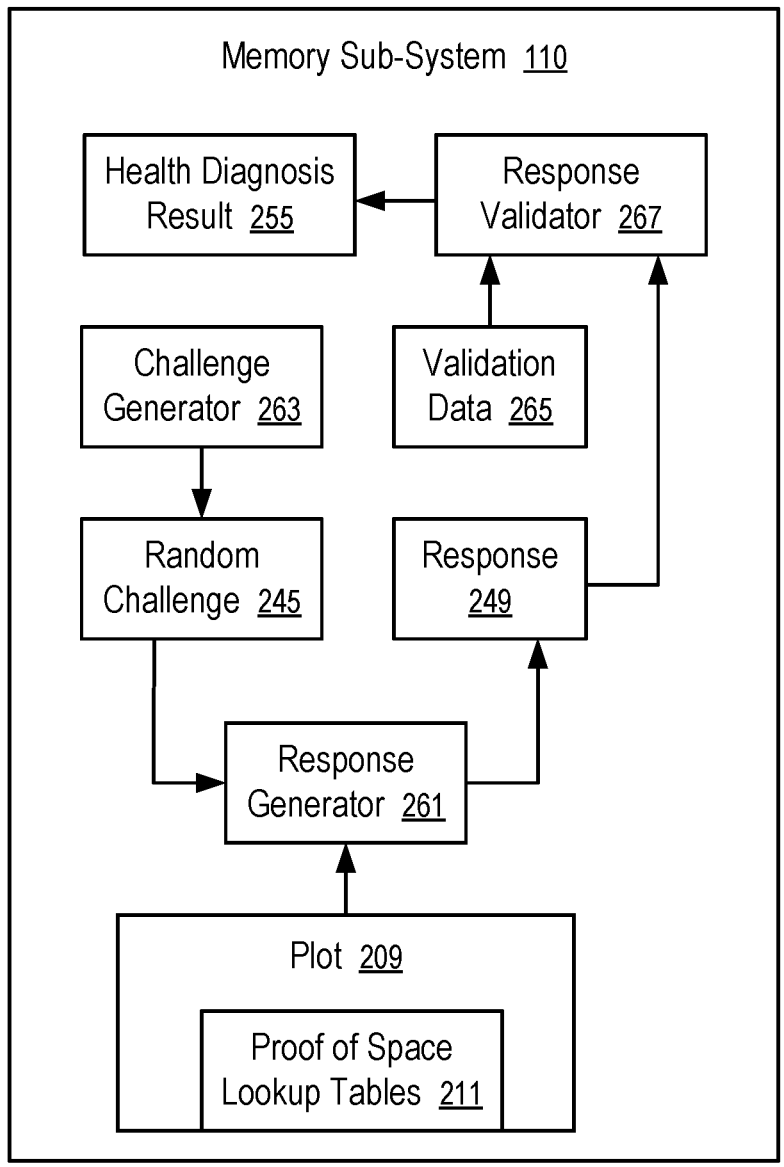
FIG. 7 shows a memory sub-system configured to autonomously test memory cells storing a proof of space plot according to one embodiment.

FIG. 7 shows a memory sub-system 110 configured to autonomously test memory cells storing a proof of space plot according to one embodiment. For example, the technique of testing and calibration using a plot 209 of proof of space illustrated in FIG. 6 can be implemented in the memory sub-system 110 of FIG. 7. The memory sub-system 110 of FIG. 7 can include a proof of space manager 113, an internal host 201, and/or other features of the memory sub-system 110 of FIG. 1 and/or FIG. 2. Optionally, the burn-in operations of FIG. 3, FIG. 4 and/or FIG. 5 can be performed in the memory sub-system 110 to generate the plot 209.

In FIG. 7, the memory sub-system 110 includes a challenge generator 263, a response generator 261, and a response validator 267. The challenge generator 263, the response generator 261, and/or the response validator 267 can be configured as part of a proof of space manager 113 and/or an internal host 201 of the memory sub-system 110.

For example, some or all of the challenge generator 263, the response generator 261, the response validator 267 can be implemented via a logic circuit. Alternatively, some or all of the challenge generator 263, the response generator 261, the response validator 267 can be implemented via firmware executed in a processing device 117 of the memory sub-system 110.

The plot 209 is stored and/or generated in the memory cells 219 of the memory sub-system 110 (e.g., during a burn-in operation, or copied from another device during initiation of the test operation).

The validation data 265 (corresponding to the input data 241 in FIG. 6) is stored in the memory sub-system 110 to enable autonomous test of memory cells 219 storing the plot 209.

After the plot 209 and the validation data 265 are in the memory sub-system 110, the memory sub-system 110 can start a test operation without being connected to any host system 120.

The challenge generator 263 can include a random number generator to generate a random challenge 245. The random challenge 245 causes the response generator 261 to read memory cells corresponding to and identified by the random challenge 245 to generate a response 249. The response validator 267 determines whether reading of the memory cells being accessed for the generation of the response 249 has any error; and the response validator 267 generates health diagnosis results 255 for the memory cells being read to generate the response 249. In some implementations, the response 249 includes the identification 253 of the memory cells being accessed in response to the challenge 245.

Typically, a small, predetermined number of memory cells are read from the plot 209 to generate the response 249 for a challenge 245. The challenge generator 263 can generate a series of random challenges 245 to sample/test the memory cells used to store the plot 209. The statistical data about the sampled results can be used to evaluate the quality level of the memory cells 219 storing the plot 209, and/or determine whether the memory sub-system 110 meets a quality control criterion.

Optionally, the response generate 261 can vary the parameters used to read the memory cells 219; and the validation results can be used to determine the optimal read parameters for the memory cells 219.

For example, to perform autonomous plot generation, memory cell test, and/or read calibration in the manufacturing facility 160, the host system 120 of the manufacturing facility 160 can write configuration data 203 into the memory sub-system 110. Subsequently, the host system 120 of the manufacturing facility 160 can be disconnected from the memory sub-system 110 (e.g., to configure another memory sub-system 110); and the memory sub-system 110 can then perform the plot generation, memory cell test, and/or read calibration without further assistance from the host system 120 of the manufacturing facility 160. After the autonomous operations, the host system 120 can be connected again to the memory sub-system 110 to inspect the health diagnosis results 255 for further processing of the memory-sub-system 110. Optionally, the memory sub-system 110 can communicate with other devices (e.g., memory sub-systems 171, 173) active on the computer network in the manufacturing facility 160 to obtain the plot 209 for memory test and/or calibration, and/or to report the health diagnosis result 255 to a server system of the manufacturing facility 160.

Figure 8:
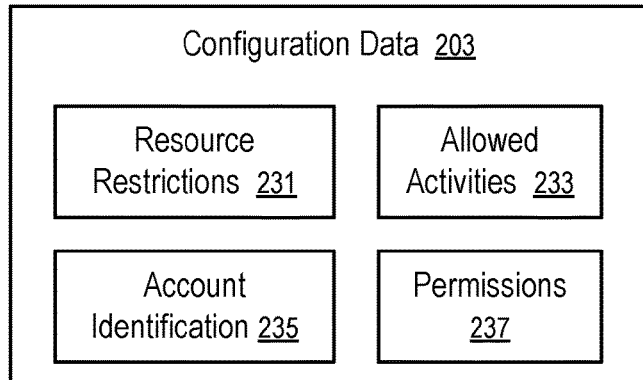
FIG. 8 shows an example of configuration data to control proof of space activities according to one embodiment.

FIG. 8 shows an example of configuration data to control proof of space activities according to one embodiment. For example, the configuration data 203 of the internal host 201 of FIG. 2 can be implement in a way as illustrated in FIG. 8.

In FIG. 8, the configuration data 203 includes resource restrictions 231, allowed activities 233, account identification 235, permissions 237, etc.

For example, resource restrictions 231 can specify a limit on the percentage of the storage capacity 205 of the memory sub-system 110 that is allowed to be used by the proof of space manager 113 to store one or more plots 209.

For example, resource restrictions 231 can specify a limit on the percentage of the computing resources of the memory sub-system controller 115 that can be used by the internal host 201.

For example, resource restrictions 231 can specify a limit on data access bandwidth to the storage capacity 205 that is allowed to be used by the internal host 201.

For example, resource restrictions 231 can specify a limit on program-erase budget of the storage capacity 205 that is allowed to be used by the internal host 201.

When an activity (e.g., plot generation, plot farming) is explicitly specified as one of the allowed activities 233, the proof of space manager 113 can perform the activities 233 when connected to the network interface 215 and/or the cryptocurrency network 217. Otherwise, a portion of the internal host 201 and/or the proof of space manager 113 is blocked to prevent the activity that is not included in the allowed activities 233.

The configuration data 203 can include account identification 235 associated with an account in the cryptocurrency network 217 and/or the plot 209. For example, the account identification 235 can include a cryptographic key used to represent an owner of the account and/or as part of an initial data to generate the plot 209.

The permissions 237 in the configuration data 203 can specify whether and/or when the internal host 201 can operate autonomously. For example, the permissions 237 can be configured to indicate that the internal host 201 is permitted to start operation after receiving an explicit request from the host system 120. For example, the permissions 237 can be configured to indicate that the internal host 201 can operate autonomously when the host system 120 is inactive but cannot operate when the host system 120 is active. For example, the permission 237 can be configured to indicate that internal host 201 can operate whenever the internal host 201 can access the cryptocurrency network 217.

Figure 9:
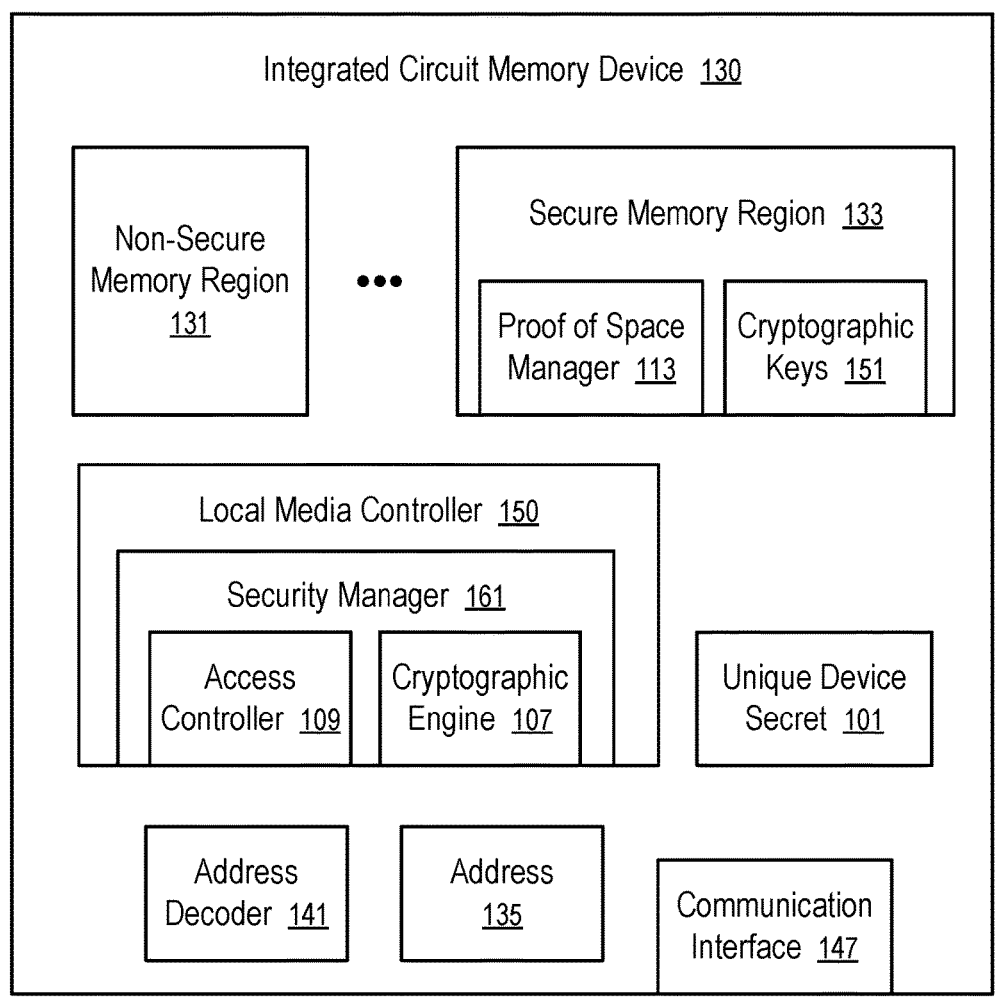
FIG. 9 shows an integrated circuit memory device configured to secure a proof of space manager according to according to one embodiment.

For improved security, the proof of space manager 113 and/or the internal host 201 can be implemented via a secure memory device as illustrated in FIG. 9.

FIG. 9 illustrates an integrated circuit memory device having a security manager according to one embodiment. For example, the memory device of FIG. 9 can be used to implement the internal host 201 of FIG. 2 via firmware.

The integrated circuit memory device 130 can be enclosed in a single integrated circuit package. The integrated circuit memory device 130 includes multiple memory regions 131, . . . , 133 that can be formed in one or more integrated circuit dies.

A typical memory cell in a memory region (e.g., 131, . . . , 133) can be programmed to store one or more bits of data.

The memory device 130 has a local media controller 150, which can implement at least a portion of a security manager 161.

The security manager 161 of the memory device 130 can include an access controller 109 and a cryptographic engine 107.

The cryptographic engine 107 can be implemented via a logic circuit and/or instructions or microcode to perform cryptographic calculations, such as applying a cryptographic hash function to a data item to generate a hash value, encrypting a data item to generate cipher text using a cryptographic key, decrypting cipher text to recover a data item using a corresponding cryptographic key, generating a cryptographic key of symmetric cryptography and/or a pair of cryptographic keys of asymmetric cryptography, etc.

The access controller 109 controls access to at least one of the memory regions 131, . . . , 133 and/or other functions of the memory device 130 based on cryptographic keys that are representative of access privileges.

For example, the security manager 161 can control access to a secure memory region 133 based on a cryptographic key that is generated based on a secret 101 of the integrated circuit memory device 130 and/or a cryptographic key representative of an owner or an authorized user of the memory device 130. For example, when a request or command to write data into the secure memory region 133 is received in the integrated circuit memory device 130, the security manager 161 verifies whether the request is from a requester having the cryptographic key. If no, the security manager 161 may reject the write request. To demonstrate that the request is from an authorized requester, the requester can digitally sign the request, or a challenge message, using the cryptographic key. When the security memory device 130 determines that the digital signature is made using the correct cryptographic key, the requester is seen to have the permission to write the data into the secure memory region 133. For example, the memory device 130 can store a cryptographic key 151 that is used to authenticate the digital signature of the signed request/command.

The memory device 130 can be configured to use different cryptographic keys 151 to access control different commands. For example, one cryptographic key 151 can be representative of the privilege to have a security command executed in the memory device 130; and the security command is used to specify that another cryptographic key 151 is representative of the privilege to read and/or write in a secure memory region 133. For example, the memory device 130 can have multiple secure memory regions (e.g., 133); and access to each of the secure memory regions (e.g., 133) can be controlled via a separate cryptographic key 151.

For example, the memory device 130 can have a unique device secret 101 that represents an identity of the memory device 130; and a cryptographic key 151 derived from the unique device secret 101 can be representative of an owner privilege to operate the memory device 130 and thus have security commands executed in the memory device.

In general, the secure memory region 133 can have different security requirements for different types of accesses (e.g., read, write, erase). For example, the secure memory region 133 can be configured to require digital signatures verifiable via the cryptographic key 151 to write or change data in the secure memory region 133 but does not require a signed command to read the data from the secure memory region 133. Alternatively, the secure memory region 133 can be configured to require digital signatures verifiable via the cryptographic key 151 to read, write, and/or change data in the secure memory region 133. Alternatively, the secure memory region 133 can be configured to require digital signatures verifiable via different cryptographic keys for different operations, such as read, write, change, erase, etc., in the secure memory region 133.

The integrated circuit memory device 130 has a communication interface 147 to receive a command having an address 135. In response to the address 135 identifying a secure memory region (e.g., 133) that is configured with access control, the security manager 161 uses the cryptographic engine 107 to perform cryptographic operations for the verification that the request is from a requester having the cryptographic key authorized for the access to the memory region 133, before providing memory data retrieved from the memory region 133 using an address decoder 141. The address decoder 141 of the integrated circuit memory device 130 converts the address 135 into control signals to select a group of memory cells in the integrated circuit memory device 130; and the local media controller 150 of the integrated circuit memory device 130 performs operations to determine the memory data stored in the memory cells at the address 135.

In FIG. 9, the firmware (e.g., instructions and data) of the proof of space manager 113 is stored in the secure memory region 133. Thus, unauthorized modification of the proof of space manager 113 can be prevented. Further, a cryptographic measurement of the firmware (e.g., a value computed by applying a cryptographic hash function on the firmware) can be stored in the memory device 130. Before the firmware is loaded and/or used (e.g., by the memory sub-system controller 115 to implement the internal host 201), the memory device 130 can validate the integrity of the firmware by comparing the current cryptographic measurement of the firmware and a stored measurement for the firmware. Thus, when the firmware is corrupted and/or tampered with, the memory device 130 can detect the corruption and prevent the use of the corrupted firmware.

Figure 10:
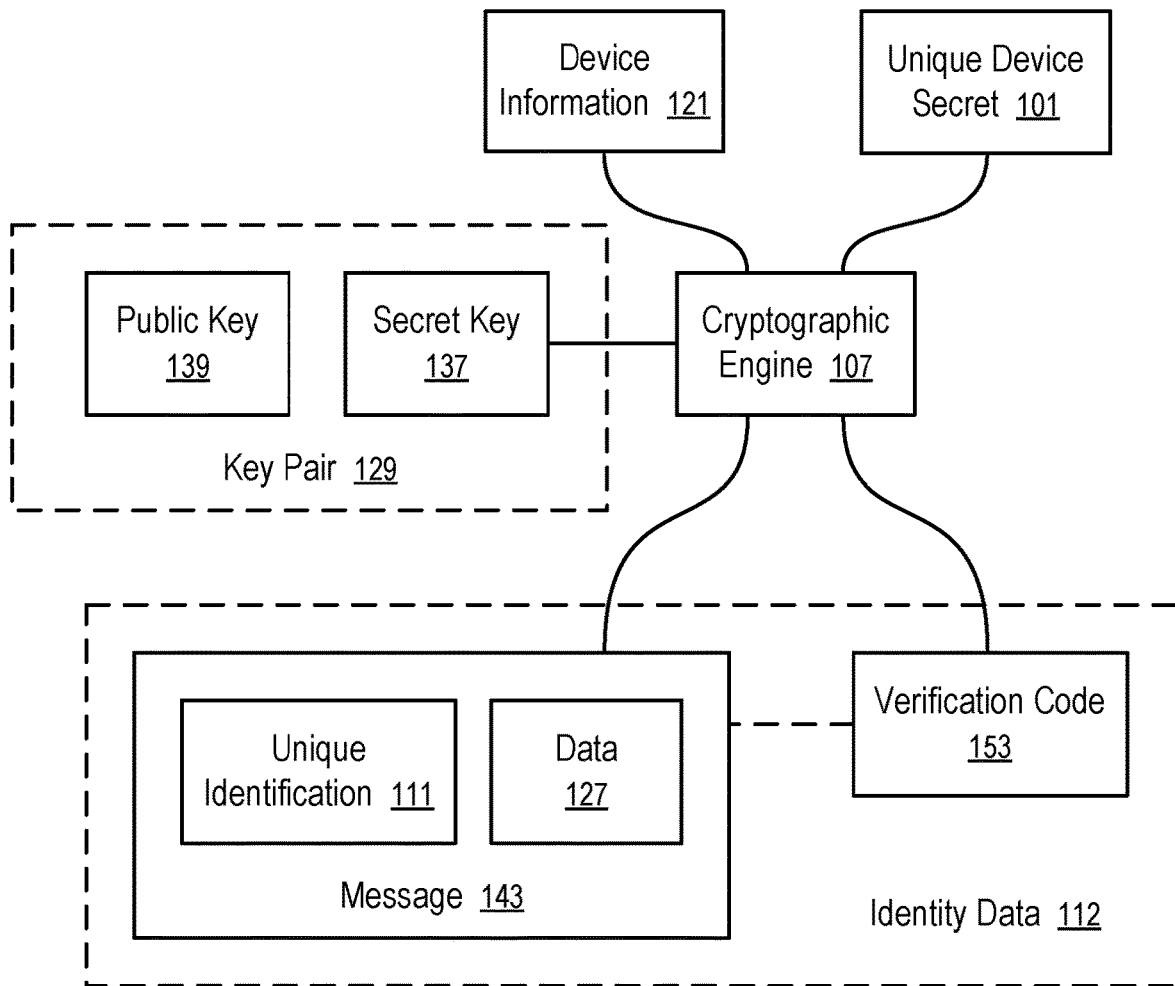
FIG. 10 illustrates the generation of identity data in an integrated circuit memory device according to one embodiment.

FIG. 10 illustrates the generation of identity data in an integrated circuit memory device according to one embodiment. For example, the technique of FIG. 10 can be implemented in the memory device 130 of FIG. 9.

In FIG. 10, the cryptographic engine 107 of a memory device 130 (e.g., as in FIG. 1) is used to generate at least a secret key 137 using its unique device secret 101 and device information 121.

For example, when asymmetric cryptography is used, the secret key 137 is a private key of a cryptographic key pair 129. An associated public key 139 is generated together with the private key using the cryptographic engine 107.

Alternatively, when symmetric cryptography is used, the secret key 137 can be generated and used without a public key 139 and without the key pair 129.

In some implementations, multiple key pairs 129 are generated and used. For example, when a method of Device Identity Composition Engine (DICE) and Robust Internet-of-Things (RIoT) is used, a first pair of asymmetric keys is referred to as device identification keys; and a second pair of asymmetric keys is referred to as alias keys. The private device identification key can be used to certify the authenticity of the alias keys and then immediately deleted and purged from the memory device 130 and to safeguard its secrecy, especially when the generation or use of the private device identification key occurs at least in part in the host system 120. The alias keys can be used in authentication in further transactions and/or communications. For example, the private device identification key can be generated at a boot time and used to sign certificates, such as a certificate of the alias public key, and then deleted. After the identity of the memory device 130 and the authenticity of the public alias key are validated or confirmed using the certificates signed using the private device identification key as the secret key 137, the private alias key can then be used as the secret key 137 of the memory device 130 in subsequent operations, until the host system 120 reboots.

For example, the device information 121 can be based on a set of instructions (e.g., software, firmware, operating system, application) to be executed by the processing device 118 of the host system 120 and/or the processing device 117 of the memory sub-system controller 115.

For example, the device information 121 can include a cryptographic hash value of the set of instructions. For example, a known hash value of the set of instructions can be stored in the memory cells; and the current hash value of the set of instructions can be computed for comparison with the known hash value. If the two hash values agree with each other, the integrity of the set of instructions is verified; and the hash value of the integrity of the set of instructions can be used as part of the device information 121 to compute the secret key 137.

Alternatively, the current hash value of the set of instructions stored in the memory cells can be used directly in the calculation of the secret key 137. If the instructions have changed (e.g., due to data corruption and/or tampering or hacking), the validation of the secret key 137 by a security server will fail.

Optionally, the device information 121 can include an identification of the set of instructions, such as a hash value of the source code of the instructions, a name of the software/firmware package represented by the instructions, a version number and/or a release date of the package, etc.

Optionally, the device information 121 can include trace data stored into the memory cells during the process of building and/or customizing the computing system having the host system 120 and the memory device 130. For example, when the memory device 130 is assembled into a component device (e.g., a memory sub-system), a piece of trace data representative of the manufacturer of the component device, the model of the component device, and/or the serial number of the component device is stored into the memory cells as part of the device information 121. Subsequently, when the component device is assembled into the computing system, a piece of trace data is added into the memory cells as part of the device information 121. Further trace data can be added to the memory cells as part of the device information 121 to reflect the history of the memory device 130 for the individualization of the identity of the memory device 130.

Optionally, the device information 121 can further include data received from the host system 120 to which the communication interface 147 of the memory device 130 is connected.

For example, the computing system can have at least the host system 120 and the memory device 130. Some of the components in the host system 120 may be removed or replaced. At the time of booting up the host system 120, a portion of the instructions stored the memory cell is executed to collect data about the components that are present in the host system 120 at the boot time. Thus, the device information 121 can represent a particular configuration of software/data and hardware combination of the memory device 130 and/or the host system 120. The secret key 137 generated based on the device information 121 and the unique device secret 101 represent the identity of the memory device 130 with the particular configuration.

To demonstrate the identity of the memory device 130 and/or the host system 120, the cryptographic engine 107 generates a verification code 153 from a message 143 and the secret key 137.

The verification code 153 of the secret key 137 and the message 143 can be constructed and/or validated using various techniques, such as hash digest, a digital signature, or a hash-based message authentication code, symmetric cryptography, and/or asymmetric cryptography. Thus, the verification code 153 is not limited to a particular implementation.

In general, verifying whether a sender of a message (e.g., 143) has a cryptographic key (e.g., 145) involves the validation of a verification code (e.g., 153) of the message (e.g., 143). The verification code can be in the form of a hash digest, a digital signature, a Hash-based Message Authentication Code (HMAC), a Cipher-based Message Authentication Code (CMAC), etc. The verification code is generated using the cryptographic key and the message as an input to cryptographic operations such as hashing, encrypting, and/or other computations such that it is generally impractical to generate the verification code without the cryptographic key and to generate the verification code from modified version of the message. Thus, when the recipient confirms that the received verification code is valid for the received message and a cryptographic key, the recipient can conclude that the sender has the corresponding cryptographic key and the received message is the same as the message used to generate the received cryptographic key.

In some implementations, the recipient performs the validation of a verification code of a message using the same cryptographic key as used by the sender to generate the verification code. For example, the recipient uses the same cryptographic key to generate the verification code of the received message and compare the generated verification code with the received verification code. If there is a match, the received verification code is valid for the received message; and the sender can be considered to have the cryptographic key. Otherwise, the received verification code is invalid for the received message; either the received message has been changed since the generation of the verification code, or the received verification code was generated using a different cryptographic key, or both.

In some implementations, the recipient performs the validation of a verification code of a message using a public cryptographic key in a key pair; and the sender generates the verification code using a private cryptographic key in the key pair. For example, the verification code can be generated by applying a hash function to the message to generate a hash value of the message. The cipher text of the hash value obtained through encrypting the hash value performed using an encryption key can be used as the verification code. A recipient of the message and the verification code performs validation using a corresponding decryption key, which is the same as the encryption key when symmetric cryptography is used and is a different key in a key pair when asymmetric cryptography is used. After recovering a hash value from the cipher text using the decryption key, the recovered hash value can be compared to the hash value of the received message; if there is a match, the received verification code is valid for the received message; otherwise, the received verification code is invalid for the received message. Alternatively, the recipient can use the encryption key to perform the validation without performing decryption. The recipient can generate the verification code of the message using the encryption key for comparison with the received verification code.

In some implementations, a message and a cryptographic key is combined to generate a hash value as the verification code, as in a technique of Hash-based Message Authentication Code (HMAC). For example, a cryptographic key can be used to generate two keys. After combining one of the two keys with the message to generate a message modified by the key, a cryptographic hash function can be applied to the key-modified message to generate a hash value, which is further combined with the other key to generate a further message. After applying the cryptographic hash function (or another cryptographic hash function) to the further message, a hash-based message authentication code is generated. A recipient of the message can use the same cryptographic key to generate the hash-based message authentication code of the received message for comparison with the received hash-based message authentication code. If there is a match, the validation is successful; otherwise, the validation fails.

In general, any techniques for generating and validating a verification code for a message from a sender and a cryptographic key used by the sender to generate the verification code can be used to determine whether the sender has the cryptographic key. The recipient is to use an appropriate cryptographic key to perform the validation, which can be the same as the cryptographic key used to generate the verification code, or in the same pair of asymmetric cryptographic key. Thus, the present disclosure is not limited to a particular technique of hash digest, digital signature, and/or hash-bashed message authentication code.

For convenience, a verification code (e.g., 153) generated for a message (e.g., 143) using a cryptographic key (e.g., 145) to represent both the message (e.g., 143) and the cryptographic key (e.g., 145) can be referred to, generally, as a digital signature of the message (e.g., 143) signed using the cryptographic key (e.g., 145), with the understanding that the verification code can be generated using various techniques, such as hash-based message authentication code.

Optionally, the message 143 can include a user identification, such as a name, an email address, a registered username, or another identifier of an owner or authorized user of the host system 120 in which the identity data 112 is generated.

Optionally, part of the message 143 can provide information in an encrypted form. For example, the information can be encrypted using a public key of the security server such that the information is not accessible to a third party.

The message 143 can be a certificate presenting the unique identification 111 of the memory device 130 and/or the host system 120. The message 143 can further present other data 127, such as a counter value maintained in the memory device 130, a cryptographic nonce, and/or other information related to the validation of the identity data 112. The memory device 130 can monotonically increase the counter value to invalidate identity data that have lower counter values to prevent replay attacks.

In some implementations, the data 127 can include part of the device information 121 used to generate the secret key 137.

In some implementations, the secret key 137 is a private alias key in a pair of asymmetric keys. The data 127 includes a certificate presenting the corresponding public alias key in the pair of asymmetric keys. The certificate presenting the public alias key is signed using a device identification key of the memory device 130. The public alias key can be used to validate the verification code 153 for the message 143 and the private alias key that is used as the secret key 137. Once the security server validates the certificate presenting the public alias key, signed using the device identification key of the memory device 130 and provided as part of the data 127, the security server can use the public alias key to validate the verification code 153 signed using the private alias key as the secret key 137. In such an implementation, the security server can use the public alias key provided in the message 143 to validate the verification code 153 without having to regenerate the pair of alias keys; and the memory device 130 can generate the alias key pair 129 using data not known to the security server.

The certificate presenting the public alias key can be generated and validated in a way as in FIG. 10, where the secret key 137 is the device identification key generated using the device information 121 and the unique device secret 101. Optionally, the memory device 130 initially provides the security server with the certificate having the public alias key. Subsequently, the memory device 130 can use the private alias key as the secret key 137 without including the public alias key in the message 143, or without including the certificate of the public alias key in the message 143.

Further, the verification of the identity of the memory device 130 can include the use of multiple secret keys and verification codes signed using the secret keys. For example, a device identification secret key can be used to initially establish the authenticity of an alias secret key and the identity of the memory device 130; and subsequently, the alias secret key can be used to validate the authenticity of the identity of the memory device 130. In general, the device identification secret key and the alias secret key can be based on asymmetric cryptography or symmetric cryptography, since the security server can generate the corresponding cryptographic keys generated by the memory device 130.

For improved security, the memory device 130 does not use the processing power outside of the memory device 130 to generate its copy of the secret key 137 and does not communicate the secret key 137 outside of the memory device 130. The generation and use of the secret key 137 are performed using the logic circuit of the cryptographic engine 107 sealed within the memory device 130.

Alternatively, part of operations to generate and use the secret key 137 can be implemented via a set of instructions stored in the memory cells and loaded into the processing device 118 of the host system 120 for execution. For improved security, the secret key 137 is not communicated across the communication interface 147 in clear text; and the instructions can be configured to purge the secret key 137 from the host system 120 after the generation and/or after the use.

The identity data 112 can be generated in response to the memory device 130 being powered up, in response to a request received in the communication interface 147, and/or in response to the host system 120 boots up (e.g., by executing a boot-loader stored in the memory cells). The data 127 can include a count value maintained in the memory device 130. The count value increases when the operation to generate the identity data 112 is performed. Thus, a version of the identity data 112 having a count value invalidates prior versions of the identity data 112 having count values lower than the count value.

Figure 11:
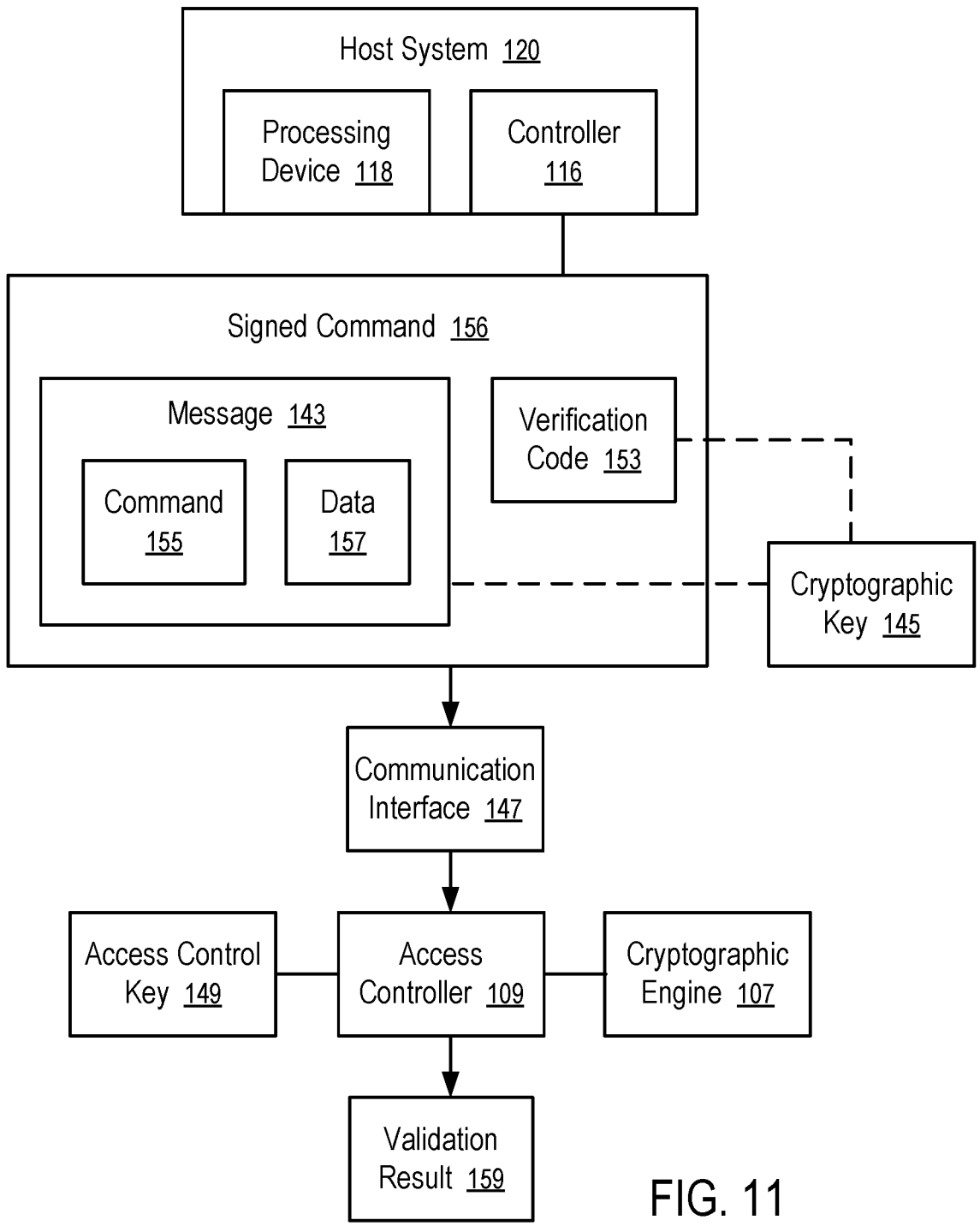
FIG. 11 illustrates a technique to control execution of a command in a memory device according to one embodiment.

FIG. 11 illustrates a technique to control execution of a command in a memory device according to one embodiment. For example, the technique of FIG. 11 can be implemented in the memory device 130 of FIG. 9.

In FIG. 11, the access controller 109 is configured with an access control key 149 to determine whether a signed command 156 received in the communication interface 147 is from an entity having the privilege to have the command 155 executed in the secure memory device 130.

When a controller 116 of a host system 120 sends a command 155 to the communication interface 147 of the memory device 130, the access controller 109 determines whether the sender of the command 155 has the privilege to request the memory device 130 to execute the command 155. The host system 120 can include one or more processing devices 118 that execute instructions implementing an operating system and/or application programs.

A cryptographic key 145 is configured to represent the privilege that is to be checked using the access control key 149. A sender of the command 155 can generate a verification code 153 from the cryptographic key 145 and a message 143 containing the command 155.

Similar to the verification code 153 discussed above in connection with FIG. 10, the verification code 153 of the cryptographic key 145 and the message 143 can be constructed and/or validated using various techniques, such as hash digest, a digital signature, or a hash-based message authentication code, symmetric cryptography, and/or asymmetric cryptography. Thus, the verification code 153 is not limited to a particular implementation; and the verification code 153 can be referred to, generally, as a digital signature of the message 143 signed using the cryptographic key 145, with the understanding that the verification code 153 can be generated using various techniques, such as hash-based message authentication code.

In FIG. 11, the access controller 109 uses a corresponding access control key 149 to validate the verification code 153 submitted to the communication interface 147 for the command 155. The access controller 109 uses the cryptographic engine 107 to generate a validation result 159 of the received message 143 and the received verification code 153. Based on the validation result 159, the access controller 109 can selectively allow the command 155 to be executed within the memory device 130 or block the execution of the command 155.

For example, the access control key 149 can be one of the cryptographic keys 151 stored in the memory device 130. Different access control keys can be used to control different privileges for executing different commands and/or for executing a command operating on different sections or regions of memory cells.

For example, one cryptographic key 145 can be representative of the privilege to have a security command executed in the memory device 130. When the security command is executed, an access control key 149 is installed (or uninstalled) in the memory device 130 for the validation of a verification code of another cryptographic key representative of the privilege to have a read command (or a write command) executed to access the secure memory region 133.

Optionally, the cryptographic key 145 is generated in the process of validating the identity of the memory device 130 based on the unique device secret 101 of the memory device 130; and a secret known between the memory device 130 and an owner of the memory device 130 allows the generation of a session key as the cryptographic key 145 to represent the privileges to have selected commands executed in the memory device 130 during a communication session. The communication session can have a time limit and/or be terminated via a command to the memory device 130.

In some implementations, a same session key used as the cryptographic key 145 representative of a privilege (e.g., to read or write the data in the secure memory region 133) and as the access control key 149 for the validation of verification codes (e.g., 153) generated using the cryptographic key 145.

In another implementations, a pair of cryptographic keys of asymmetric cryptography can be used for the session. The public key in the pair is used as the access control key 149; and the private key in the pair can be used as the cryptographic key 145 representative of the corresponding privilege.

After the installation in the memory device 130 the access control key 149 for the validation of the verification codes (e.g., 153) generated using the cryptographic key 145 representative of the privilege to read or write in the secure memory region 133, the cryptographic key 145 can be used by an authorized entity to generate the signed command 156. The signed command 156 can be transmitted to the communication interface 147 of the memory device 130 by the host system 120. After the access controller 109 validates the verification code 153 in the signed command 156, the access controller 109 allows the memory device 130 to execute the command 155.

The message 143 can include data 157 that represents restrictions on the request to execute the command 155.

For example, the data 157 can include an execution count value maintained within the memory device 130 such that verification codes generated for lower counts are invalidated.

For example, the data 157 can include a cryptographic nonce established for a specific instance of a request to execute the command 155 such that the verification code 153 cannot be reused for another instance.

For example, the data 157 can include a time window in which the verification code 153 is valid.

For example, the data 157 can include the identification of a memory region in which the command 155 is allowed to be executed.

For example, the data 157 can include a type of operations that is allowed for the execution of the command 155 in the memory device 130.

Figure 12:
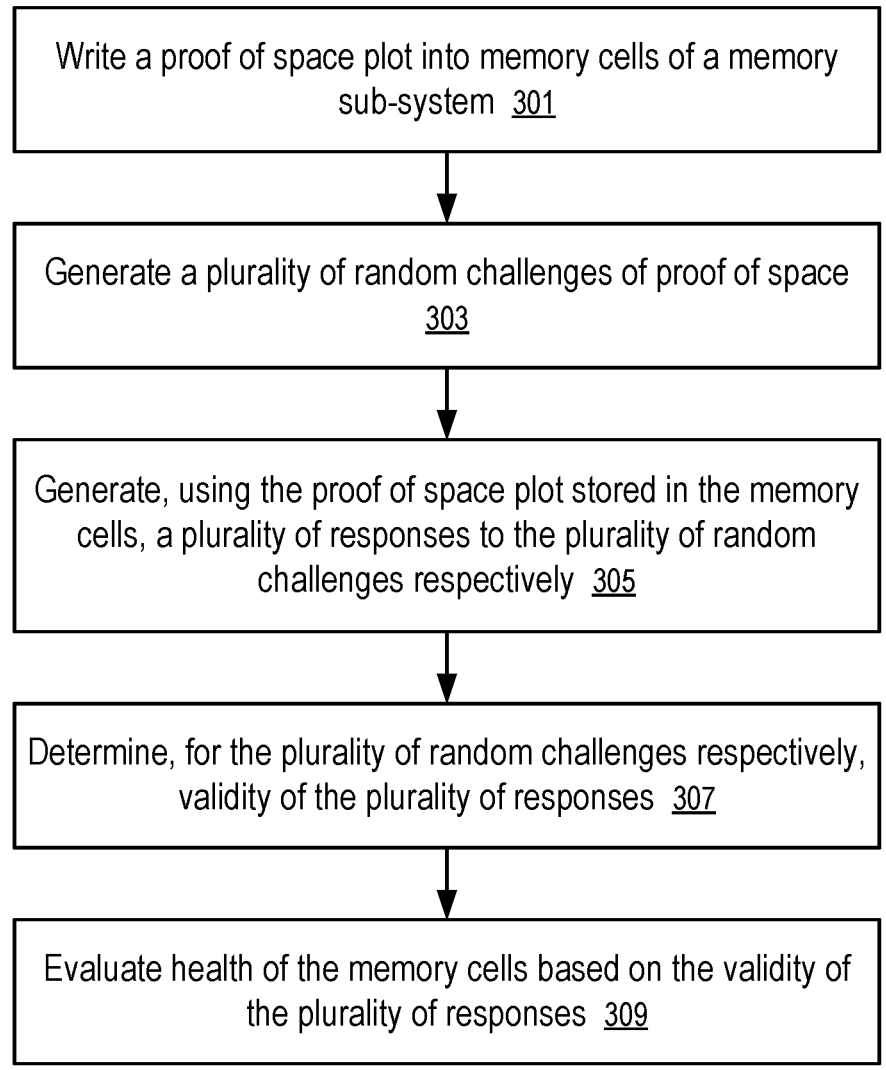
FIG. 12 shows a method to test a memory sub-system according to one embodiment.

FIG. 12 shows a method to test a memory sub-system according to one embodiment. The method of FIG. 12 can be performed at least in part by processing logic that can include hardware (e.g., processing device, circuitry, dedicated logic, programmable logic, microcode, hardware of a device, integrated circuit, etc.), software/firmware (e.g., instructions run or executed on a processing device), or a combination thereof. In some embodiments, the method of FIG. 12 is performed at least in part by the controller 115 and/or the local media controller 150 of the memory sub-system 110 in FIG. 1 or FIG. 7, and/or by the processing device 118 of the host system 120 in FIG. 1 or FIG. 3. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

For example, the method of FIG. 12 can be used to test a memory sub-system 110 in a manufacturing facility 160 and/or after the memory sub-system 110 leaves the manufacturing facility 160 and is installed into an endpoint device.

At block 301, a proof of space plot 209 is written into memory cells 219 of the memory sub-system 110.

At block 303, a plurality of random challenges 245 of proof of space are generated.

At block 305, the memory sub-system 110 generates, using the proof of space plot 209 stored in the memory cells 219, a plurality of responses 249 to the plurality of random challenges 245 respectively.

At block 307, the memory sub-system 110 determines, for the plurality of random challenges 245 respectively, validity of the plurality of responses 249.

At block 309, the memory sub-system 110 evaluates health of the memory cells 219 based on the validity of the plurality of responses 249.

For example, the memory sub-system 110 can be a solid state drive having a host interface, memory cells 219 formed on at least one integrated circuit dies, and a processing device 117 configurable to function as an internal host 201 to control an autonomous self-test of its memory cells 219. After storing in the memory sub-system 110 validation data 265 that is significantly smaller in size than the proof of space plot 209, the internal host 201 can automatically perform the determining of the validity of the plurality of responses 249 using the validation data 265. During the autonomous self-test, the host interface of the memory sub-system 110 can be disconnected from any host systems; and the internal host 201 can automatically generate the plurality of random challenges 245, identify first memory cells being accessed during generation of the plurality of responses 249, and evaluate the health of the memory sub-system 110 based at least in part on the identification 253 of the first memory cells.

Optionally, the internal host 201 can vary parameters used in reading the first memory cells during generation of the plurality of responses, and identify optimized parameters to read the first memory cells based on the validity of the plurality of responses.

For example, the internal host 201 can calibrate, periodically and prior to erasure of the proof of space plot 209 to reclaim storage space occupied by the proof of space plot 209, read parameters of memory cells 219 of the memory sub-system 110 based on validating responses 249 to random challenges 245 of space occupied by the proof of space plot 209.

Based on determination of optimized parameters for reading the first memory cells over a period of time, a model of optimized reading parameters changing over time for the memory cells 219 in the memory sub-system can be established for the prediction of optimized read parameters used in subsequent read operations (e.g., after the plot 209 is erased to reclaim its storage space).

The autonomous self-test can be performed during quality control while the memory sub-system 110 is in the manufacturing facility 160. After loading the memory sub-system 110 on a production line in the manufacturing facility 160, the memory sub-system 110 can be connected to a host system 120 on the production line to configure the autonomous self-test. The host system 120 can write configuration data 203 into the memory sub-system 110, which configures the internal host 201 to generate the random challenges 245, generate the respective responses 249 using the plot 209, and determine the validity of the respective responses 249. After disconnecting the host system 120 on the production line from the memory sub-system 110, the memory sub-system 110 can start and/or continue the autonomous self-test using the proof of space plot 209 stored in the memory sub-system 110.

Optionally, the host system 120 on the production line can further configure the memory sub-system to perform read and write operations according to computations for generation of the proof of space plot 209 while the memory sub-system 110 is on the production line (e.g., as a burn-in operation).

Thus, the memory sub-system 110 can be provided as a product of the production line, with the proof of space plot 209 stored in the memory sub-system 110 as a by-product, usable to participate in plot farming in a cryptocurrency network 217, self-test, and/or read parameter calibration.

In one embodiment, a method is provided to burn in a memory sub-system according to one embodiment. For example, the method of FIG. 12 can be performed for the burn-in of memory sub-systems 110, 171, 173, . . . , 175 in a manufacturing facility 160 of FIG. 3.

In the method, a memory sub-system (e.g., 110, 171, 173, . . . , or 175) is loaded on a production line in a manufacturing facility 160.

For example, the production line starts a burn-in operation to the memory sub-system (e.g., 110, 171, 173, . . . , or 175) in the manufacturing facility 160.

For example, to configure the burn-in operation, a host system 120 of the manufacturing facility 160 is connected to a host interface of the memory sub-system (e.g., 110, 171, 173, . . . , or 175). Through the burn-in connection 163, the host system 120 can provide an initial data set and the configuration data 203 to place the internal host 201 in an autonomous burn-in mode.

For example, an initial data set can include a public cryptographic key associated with a team of users of a cryptocurrency network; and a small amount of the initial data can be sufficient for the computation of the entire plot 209, including the proof of space lookup tables 211.

Optionally, the entire computation of the plot 209 can be divided into a plurality of stages; and the burn-in connection 163 can be used to set up the stage of computation assigned to the memory sub-system (e.g., 110, 171, 173, . . . , or 175). Thus, the initial data set can include a partial plot (e.g., 172, 174, . . .) computed by another memory sub-system during its burn-in operation, or by the host system 120.

In some implementations, the internal host 201 can be connected to a computer network within the manufacturing facility 160 without being concurrently connected to the host system 120 of the manufacturing facility 160 through the host interface of the memory sub-system 110. For example, the network connection can be made by the internal host 201 using a transceiver of the memory sub-system 110, where the transceiver is operable to establish a wired or wireless network connection to a cryptocurrency network with a blockchain using proof of space to regulate cryptocurrency activities. Alternatively, a connection from the memory sub-system 110 to a computer bus in the manufacturing facility 160 allowed the internal host 201 to access a computer network interface card to establish a wired or wireless network connection in an autonomous burn-in mode.

Alternatively, the host system 120 can generate the read/write commands in the burn-in operations and perform the computations to generate the data for the write commands transmitted to the memory sub-system (e.g., 110, 171, 173, . . . , or 175) through the burn-in connection 163 during the burn-in operation.

For example, during the burn-in operation, read and write accesses are performed to memory cells in the memory sub-system (e.g., 110, 171, 173, . . . , or 175) according to computations for generation of a proof of space plot 209.

For example, based on a small amount of initial data provided by the host system 120 of the manufacturing facility 160, the memory sub-system (e.g., 110, 171, 173, . . . , or 175) can be controlled by its internal host 201 to perform the computations and data accesses for the generation of the plot 209 (or a partial plot 172). For example, the internal host 201 is configured to compute the values of the entries in the proof of space lookup tables 211 according to a predetermined algorithm using the initial data and/or the previously calculated values in plot 209. The internal host 201 generates read commands to access the previously calculated data in the plot 209 and generates write commands to store the currently calculated data for the plot 209.

Optionally, the wearing caused by the computations for the generation of the proof of space plot 209 is distributed into a plurality of memory sub-systems (e.g., 171, 173, . . . , 175 as illustrated in FIG. 4) that are subjected to burn-in in the manufacturing facility 160. The computations for the generation of the proof of space plot 209 into a plurality of stages. The plurality of memory sub-systems (e.g., 171, 173, . . . , 175) are assigned to perform the plurality of stages respectively during burn-in of the plurality of memory sub-systems (e.g., 171, 173, . . . , 175).

For example, the host system 120 can assign the stages to the plurality of memory sub-systems (e.g., 171, 173, . . . , 175) respectively via its burn-in connections (e.g., 163) to the host interfaces of the plurality of memory sub-systems (e.g., 171, 173, . . . , 175).

Alternatively, after placing the plurality of memory sub-systems (e.g., 171, 173, . . . , 175) in the autonomous burn-in mode, the plurality of memory sub-systems (e.g., 171, 173, . . . , 175) can communicate with each other in a computer network within the manufacturing facility 160 to automatically propagate the results of the different stages (e.g., partial plots 172, 174, . . .) and the tasks of the different stages.

In one implementation, a current memory sub-system (e.g., 171) that performs a current stage of computations for the generation of a plot 209 is configured to communicate, via the host system 120 of the manufacturing facility, a partial plot (e.g., 172) resulting from the current stage, to a next memory sub-system (e.g., 173) that can perform the next stage during its burn-in operation. In another implementation, the current memory sub-system (e.g., 171) is configured to autonomously perform the current stage of computations and communicate the partial plot (e.g., 172) to the next memory sub-system (e.g., 173) via a computer network in the manufacturing facility 160 without going through and/or assistance from the host system 120 of the manufacturing facility 160.

For example, the configuration data 203 can cause the internal hosts (e.g., 201) of the memory sub-systems (e.g., 171, 173, . . . , 175) each to identify, over the computer network in the manufacturing facility 160, a next memory sub-system (e.g., 173) among memory sub-systems ready for burn-in to perform a next stage of computation based on a partial plot (e.g., 172) generated by the respective memory sub-system (e.g., 171) performing a current stage of computation.

For example, the burn-in operation applied to the memory sub-system (e.g., 110, 171, 173, . . . , or 175) is completed in the manufacturing facility 160.

For example, after the burn-in operation, the memory sub-system (e.g., 110, 171, 173, . . . , or 175) is provided (e.g., for delivery 165) from the manufacturing facility 160 as a product of the production line, with the memory cells of the memory sub-system (e.g., 110, 171, 173, . . . , or 175) storing the proof of space plot 209 as a by-product of the burn-in operation.

The memory sub-system (e.g., 110, 171, 173, . . . , or 175) can have a logic circuit operable as an internal host 201 to perform at least part of computations of generation of the proof of space plot 209. Alternatively, a processing device 117 of the memory sub-system (e.g., 110, 171, 173, . . . , or 175) can be configurable via firmware to function as an internal host 201 to perform computations of generation of the proof of space plot 209.

For example, the memory sub-system (e.g., 110, 171, 173, . . . , or 175) can be a solid state drive with memory cells formed on one or more integrated circuit dies.

In one embodiment, a method is provided to control proof of space activities. For example, the method can be implemented via operations performed by a proof of space manager 113 in an internal host 201 of FIG. 2 with configuration data 203 of FIG. 8.

In the method, a memory sub-system 110 having an internal host 201 receives configuration data 203 from a user of the memory sub-system 110.

For example, the memory sub-system 110 has a host interface configured to be coupled to a peripheral bus (e.g., a USB bus, a SATA bus, a PCI bus, a PCIe bus, etc.) to receive commands from a host system 120. The host system 120 can run an application to present a graphical user interface 213 for the user to specify the configuration data 203. For example, the configuration data 203 can include some or all of the items illustrated in FIG. 8.

Alternatively, the internal host 201 can function as a host of a network interface 215 and use the network interface 215 to establish a network connection to a user device. The user can use the user device to specify the configuration data 203 over the network connection.

Optionally, the memory sub-system 110 can have a transceiver operable to establish, under the control of the internal host 201, a wired or wireless network connection to a computer network without assistance from the host system 120. The user can use a user device to specify the configuration data 203 over the network connection established using the transceiver of the memory sub-system 110.

The memory sub-system 110 can have a controller 115 that controls executions of commands to retrieve data from and store data to the data storage medium of the memory sub-system 110. The commands can be from the host system 120, or from the internal host 201. For example, a processing device 117 of the controller 115 can execute firmware to implement the control. Optionally, the internal host 201 is also implemented via firmware executed by the processing device 117. Alternatively, a separate, internal host interface is configured in the memory sub-system 110 to connect the internal host 201 to the memory sub-system controller 115.

When the internal host 201 is implemented via firmware, the firmware of the internal host 201 and/or the configuration data 203 can be stored in a secure memory device (e.g., 130 illustrated in FIG. 9). The secure memory device 130 is configured to determine integrity of the firmware and the configuration data of the internal host 201, and control write access to the memory cells in a secure memory region 133 based on privileges represented by cryptographic keys, as in FIG. 11. For example, the secure integrated circuit memory device 130 can have a security manager 161 configured to prevent unauthorized access to the secure memory region 133 and to detect corruptions or changes in the firmware stored in the portion of the memory cells.

In one implementation, the memory sub-system 110 is a solid state drive (SSD); and the data storage medium includes the storage capacity 205 provided by memory cells formed on one or more integrated circuit dies of memory devices (e.g., 130, 140). In another implementation, the memory sub-system 110 is a hard disk drive (HDD).

The memory sub-system 110 stores the configuration data 203 in the memory sub-system 110.

The memory sub-system 110 controls operations of the internal host 201 according to the configuration data 203.

For example, the configuration data 203 can specify whether the internal host 201 is allowed to operate autonomously and independent from the host system 120, a limit or restriction 231 on resources usable by the internal host 201 to participate in proof of space activities, an identification of a type of proof of space activities the internal host 201 is allowed to participate autonomously, a condition to allow the internal host to operate autonomously, or an account identification 235 in the cryptocurrency network 217, or any combination thereof.

The internal host 201 detects a network connection.

The memory sub-system 110 communicates, using the network connection without assistance from a host system 120 connected to a host interface of the memory sub-system 110, with a cryptocurrency network 217.

For example, under the control of the internal host 201, the memory sub-system 110 can communicate with the cryptocurrency network 217 while the host system 120 is in a sleep/hibernation mode, or without the memory sub-system 110 being connected to a host system 120.

The internal host 201 generates, independent of the host system 120, commands to operate on memory cells in the memory sub-system 110 in participation in proof of space activities in the cryptocurrency network 217.

For example, the internal host 201 can generate write commands to store a plot 209 in the memory cells of a memory device 130 configured in the memory sub-system 110. The internal host 201 can perform the computations to generate the plot 209, or receive the plot 209 over the network connection. The plot 209 includes a plurality of lookup tables usable to generate a response to a proof of space challenge.

For example, the internal host 201 can generate read commands to use a plot 209 stored in the memory cells of a memory device 130 configured in the memory sub-system 110 to generate a response to a proof of space challenge.

Thus, the internal host 201 can use the storage capacity 205 in an autonomous way to generate plots, store plots, and/or farm plots in an application of proof of space (e.g., in a cryptocurrency network 217), without using the resources of an external host system 120. The resources of the memory sub-system 110 used by the internal host 201 in the proof of space activities and/or cryptocurrency activities can be controlled by the configuration data 203 to avoid undesirable performance degradation in servicing the external host system 120.

A non-transitory computer storage medium can be used to store instructions of the firmware of a memory sub-system (e.g., 110). When the instructions are executed by the controller 115 and/or the processing device 117, the instructions cause the controller 115, the processing device 117, and/or a separate hardware module to perform the methods discussed above.

Figure 13:
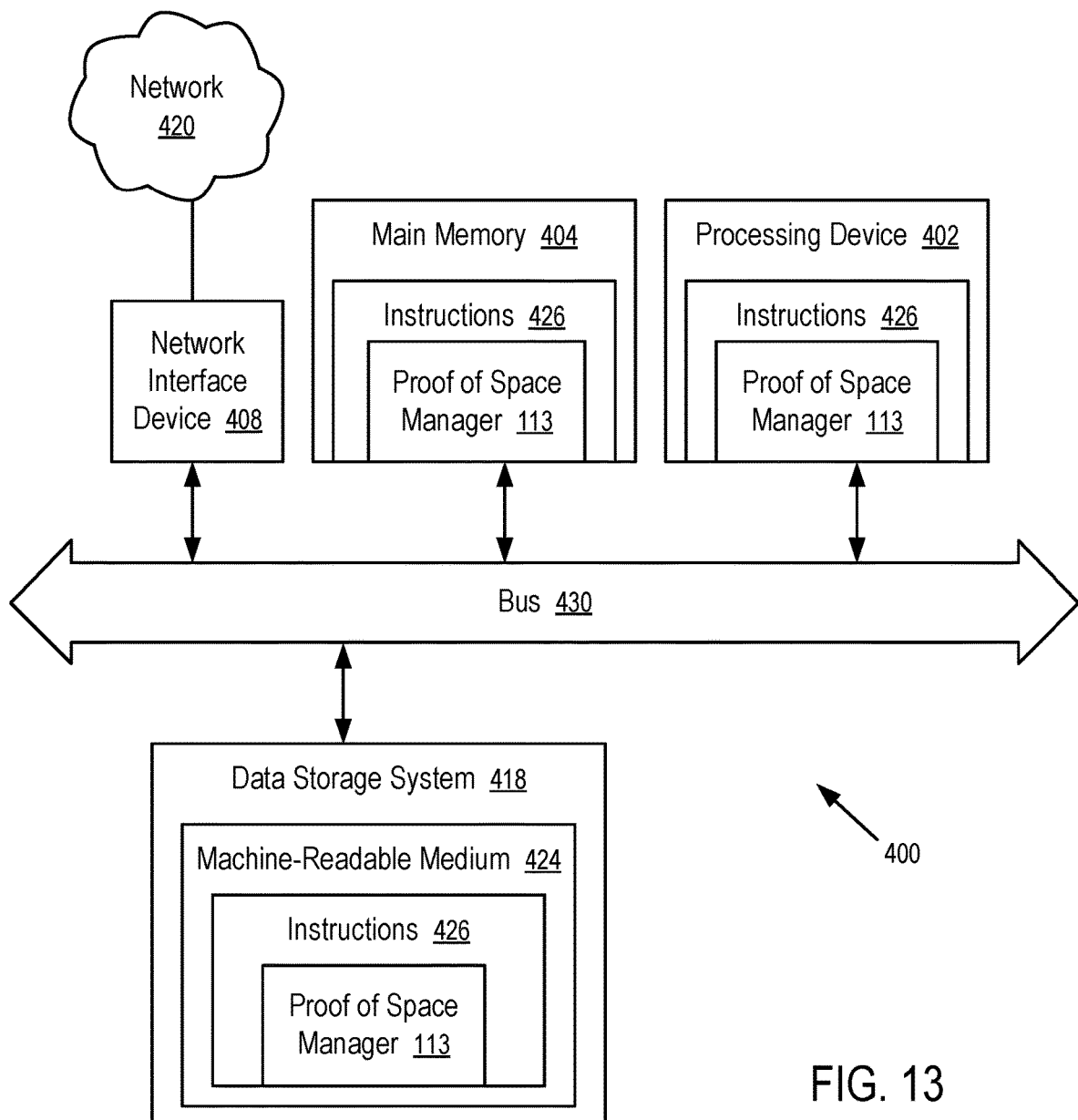
FIG. 13 is a block diagram of an example computer system in which embodiments of the present disclosure can operate.

FIG. 13 illustrates an example machine of a computer system 400 within which a set of instructions, for causing the machine to perform any one or more of the methodologies discussed herein, can be executed. In some embodiments, the computer system 400 can correspond to a host system (e.g., the host system 120 of FIG. 1) that includes, is coupled to, or utilizes a memory sub-system (e.g., the memory sub-system 110 of FIG. 1) or can be used to perform the operations of a proof of space manager 113 (e.g., to execute instructions to perform operations corresponding to the proof of space manager 113 described with reference to FIGS. 1-10). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), static random access memory (SRAM), etc.), and a data storage system 418, which communicate with each other via a bus 430 (which can include multiple buses).

Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable medium 424 (also known as a computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable medium 424, data storage system 418, and/or main memory 404 can correspond to the memory sub-system 110 of FIG. 1.

In one embodiment, the instructions 426 include instructions to implement functionality corresponding to a proof of space manager 113 (e.g., the proof of space manager 113 described with reference to FIGS. 1-10). While the machine-readable medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to convey the substance of their work most effectively to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In this description, various functions and operations are described as being performed by or caused by computer instructions to simplify description. However, those skilled in the art will recognize what is meant by such expressions is that the functions result from execution of the computer instructions by one or more controllers or processors, such as a microprocessor. Alternatively, or in combination, the functions and operations can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:
    writing a proof of space plot into memory cells of a memory sub-system;
    generating a plurality of random challenges of proof of space;
    generating, using the proof of space plot stored in the memory cells, a plurality of responses to the plurality of random challenges respectively; and
    determining validity of the plurality of responses.

2. The method of claim 1, further comprising:
    storing, in the memory sub-system, validation data, wherein the determining of the validity of the plurality of responses is performed by the memory sub-system using the validation data.

3. The method of claim 2, wherein the plurality of random challenges are generated within the memory sub-system.

4. The method of claim 3, further comprising: identifying, by the memory sub-system, first memory cells being accessed during generation of the plurality of responses, wherein evaluating a health of the first memory cells is performed by the memory sub-system based at least in part on the identifying of the first memory cells.

5. The method of claim 4, further comprising:
    varying parameters used in reading the first memory cells during generation of the plurality of responses; and
    identifying, from the parameters and based on the validity of the plurality of responses, parameters optimized to read the first memory cells.

6. The method of claim 5, further comprising:
    calibrating, periodically and prior to erasure of the proof of space plot to reclaim storage space occupied by the proof of space plot, read parameters of memory cells of the memory sub-system based on validating responses to random challenges of space occupied by the proof of space plot.

7. The method of claim 4, further comprising:
    loading the memory sub-system on a production line in a manufacturing facility;
    connecting the memory sub-system to a host system on the production line;
    configuring, by the host system, the memory sub-system, to generate the random challenges and to determine the validity of the plurality of responses; and
    disconnecting the host system from the memory sub-system, wherein while being disconnected from the host system, the memory sub-system performs an autonomous self-test using the proof of space plot stored in the memory sub-system.

8. The method of claim 7, further comprising:
    performing, while the memory sub-system on the production line, read and write operations according to computations for generation of the proof of space plot.

9. The method of claim 7, further comprising:
    providing the memory sub-system as a product of the production line, with the proof of space plot stored in the memory sub-system as a by-product.

10. The method of claim 7, wherein the memory sub-system is a solid state drive having a host interface, memory cells formed on at least one integrated circuit, and a processing device configurable to function as an internal host to control the autonomous self-test.

11. A memory sub-system, comprising:
    a host interface operable to receive commands from a host system to read data from the memory sub-system and to write data to the memory sub-system;
    memory cells formed on at least one integrated circuit; and
    a processing device operable to control execution of the commands;
    wherein, after a proof of space plot is written into the memory cells, the memory sub-system is configured to:
    generate a plurality of random challenges of proof of space;
    generate, using the proof of space plot stored in the memory cells, a plurality of responses to the plurality of random challenges respectively; and
    determine validity of the plurality of responses.

12. The memory sub-system of claim 11, further configured to store validation data to determine the validity of the plurality of responses.

13. The memory sub-system of claim 12, further configured to identify first memory cells being accessed during generation of the plurality of responses, wherein a health of the first memory cells is evaluated based at least in part on identifications of the first memory cells.

14. The memory sub-system of claim 13, further configured to:
    vary parameters used in reading the first memory cells during generation of the plurality of responses; and
    identify, from the parameters and based on the validity of the plurality of responses, parameters optimized to read the first memory cells.

15. The memory sub-system of claim 14, further configured to calibrate, periodically and prior to erasure of the proof of space plot to reclaim storage space occupied by the proof of space plot, read parameters of memory cells of the memory sub-system based on validating responses to random challenges of space occupied by the proof of space plot.

16. The memory sub-system of claim 15, further configured to perform, while the memory sub-system is in a production line in a manufacturing facility but is disconnected from a host system on the production line, read and write operations according to computations for generation of the proof of space plot, while the memory sub-system is disconnected.

17. The memory sub-system of claim 16, wherein the memory sub-system stores the proof of space plot as a by-product when the memory sub-system is provided as a product of the production line; the memory sub-system is a solid state drive; and the processing device is configurable to function as an internal host to control an autonomous self-test of health of memory sub-system using the proof of space plot.

18. A non-transitory computer storage medium storing instructions which, when executed in a memory sub-system, cause the memory sub-system to perform a method, comprising:
- writing a proof of space plot into memory cells of the memory sub-system;
- generating a plurality of random challenges of proof of space;
- generating, using the proof of space plot stored in the memory cells, a plurality of responses to the plurality of random challenges respectively; and
- determining validity of the plurality of responses.

19. The non-transitory computer storage medium of claim 18, wherein the method further comprises:
- varying parameters used in reading first memory cells during generation of the plurality of responses; and
- identifying, from the parameters and based on the validity of the plurality of responses, parameters optimized to read the first memory cells.

20. The non-transitory computer storage medium of claim 19, wherein the method further comprises:
- calibrating, periodically and prior to erasure of the proof of space plot to reclaim storage space occupied by the proof of space plot, read parameters of memory cells of the memory sub-system based on validating responses to random challenges of space occupied by the proof of space plot.

* * * * *